US012765239B2

(12) United States Patent
Kim et al.

(10) Patent No.: US 12,765,239 B2
(45) Date of Patent: Oct. 13, 2026

(54) DISPLAY DEVICE

(71) Applicant: LG Display Co., Ltd., Seoul (KR)

(72) Inventors: Heecheol Kim, Seoul (KR); Donghwi Kim, Seoul (KR); Dongyeon Kim, Goyang-si (KR); Gyusuk Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 410 days.

(21) Appl. No.: 18/371,822

(22) Filed: Sep. 22, 2023

(65) Prior Publication Data

US 2024/0138239 A1 Apr. 25, 2024
US 2024/0237497 A9 Jul. 11, 2024

(30) Foreign Application Priority Data

Oct. 24, 2022 (KR) ........................ 10-2022-0137317

(51) Int. Cl.
*H10K 59/80* (2023.01)
*H10K 59/82* (2023.01)

(52) U.S. Cl.
CPC ........... *H10K 59/878* (2023.02); *H10K 59/82* (2023.02); *H10K 59/879* (2023.02)

(58) Field of Classification Search
CPC .... H10K 59/878; H10K 59/82; H10K 59/879; H10H 20/857; H10H 20/852; H10H 20/835; H10H 20/856; H10H 20/841; H10W 90/00; H10D 86/441
See application file for complete search history.

(56) References Cited

U.S. PATENT DOCUMENTS

2020/0373366 A1 11/2020 Sim et al.
2021/0066564 A1 3/2021 Kanaya
2021/0202789 A1 * 7/2021 Tezcan ............. H10H 20/01335
2021/0305222 A1 9/2021 Min et al.
2025/0336898 A1 10/2025 Miin et al.

FOREIGN PATENT DOCUMENTS

KR 1020190109984 A 9/2019
KR 10-2020-0006209 A 1/2020
KR 1020200133653 A 11/2020
KR 10-2021-0027097 A 3/2021

OTHER PUBLICATIONS

Office Action issued on Dec. 2, 2025 in Korean Patent Application No. 10-2022-0137317.

* cited by examiner

*Primary Examiner* — Karen Kusumakar
(74) *Attorney, Agent, or Firm* — Morgan, Lewis & Bockius LLP

(57) ABSTRACT

A display device includes a substrate having one surface and an opposite surface opposite to the one surface; a micro-LED on the one surface of the substrate, the micro-LED including a light-emitting area; a reflective electrode at at least one side surface of the micro-LED; and an upper reflective layer facing and overlapping the light-emitting area of the micro-LED, wherein the upper reflective layer is configured to reflect light emitted from the light-emitting area of the micro-LED to be directed toward the second surface of the substrate.

7 Claims, 13 Drawing Sheets

DISPLAY DEVICE

CROSS-REFERENCE TO RELATED APPLICATION

This application claims the benefit of Korean Patent Application No. 10-2022-0137317 filed on Oct. 24, 2022, which is hereby incorporated by reference.

BACKGROUND

Technical Field

The present disclosure relates to a display device, and more particularly, to a display device capable of improving light output efficiency.

Discussion of the Related Art

A display device is applied to various electronic devices, such as TVs, mobile phones, laptops and tablets. To this end, research continues to develop display devices with thinner profile, lighter weight, and lower power consumption.

Among display devices, a light-emitting display device has a light-emitting element or a light source built therein and displays information using light generated from the built-in light-emitting element or light source. A display device including a self-light-emitting element may be implemented to be thinner than a display device with the built-in light source, and may be implemented as a flexible display device that may be folded, bent, or rolled.

The display device having the self-light-emitting element may include, for example, an organic light-emitting display device (OLED) including a light-emitting layer made of an organic material, or a micro-LED display device (micro light-emitting diode display device) including a light-emitting layer made of an inorganic material. In this regard, the organic light-emitting display device does not require a separate light source. However, due to material characteristics of the organic material that is vulnerable to moisture and oxygen, a defective pixel easily occurs in the organic light-emitting display device due to an external environment. On the contrary, the micro-LED display device includes the light-emitting layer made of the inorganic material that is resistant to moisture and oxygen and, thus, is not affected by the external environment. As a result, the micro-LED display device has high reliability and has a long lifespan compared to the organic light-emitting display device.

The micro-LED display device is resistant to the external environment, and thus does not require a protective structure, such as a sealing material, and various types of materials may be used as a material of a substrate of the device. Thus, the micro-LED display device may be thinner than the organic light-emitting display device and is more advantageous in being implemented as a flexible display device. The plurality of micro-LED display devices may be arranged in a matrix manner to implement a large area display apparatus.

Accordingly, research is being conducted to improve the characteristics of the micro-LED display device while increasing light-emitting efficiency for various applications of the micro-LED display device.

SUMMARY

Accordingly, embodiments of the present disclosure are directed to a display device that substantially obviates one or more of the problems due to limitations and disadvantages of the related art.

An aspect of the present disclosure is to provide a micro-LED display device capable of preventing deterioration in light output efficiency at which light is emitted to the outside during a light-emitting operation of the micro-LED display device.

A further aspect of the present disclosure is to provide a micro-LED display device capable of preventing degradation of luminance of light in a frontward direction during light-emitting operation of the micro-LED display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate having a first surface and a second surface opposite to the first surface; a micro-LED on the first surface of the substrate, the micro-LED including a light-emitting area; a reflective electrode at at least one side surface of the micro-LED; and an upper reflective layer facing and overlapping the light-emitting area of the micro-LED, wherein the upper reflective layer is configured to reflect light emitted from the light-emitting area of the micro-LED to be directed toward the second surface of the substrate.

In another aspect, a display device comprises a substrate; a protective layer on the substrate; a micro-LED on the protective layer; a contact-hole on at least one side surface of the micro-LED; a reflective electrode on an exposed surface of the contact-hole; a bank in the contact-hole, wherein the bank has a bank hole defined therein exposing a light-emitting area of the micro-LED; a planarization film on the light-emitting area of the micro-LED and the bank; and an upper reflective layer on the planarization film to vertically overlap the light-emitting area of the micro-LED.

According to the aspects of the present disclosure, introducing the micro-LED display device operating in a bottom-emission scheme may allow the light output efficiency to be prevented from deteriorating, which may otherwise occur during an operation of a micro-LED display device operating in a top-emission scheme.

Further, introducing a micro-LED display device operating in a bottom-emission scheme may allow a light path to be controlled such that the luminance of light in a frontward direction is prevented from deteriorating, and a uniform light output profile is achieved in an entire light-emitting area.

Further, in a micro-LED display device operating in the bottom-emission scheme, the upper electrode layer may be configured in various shapes so that the path of light may be effectively changed such that the light is directed in the frontward direction of the substrate.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
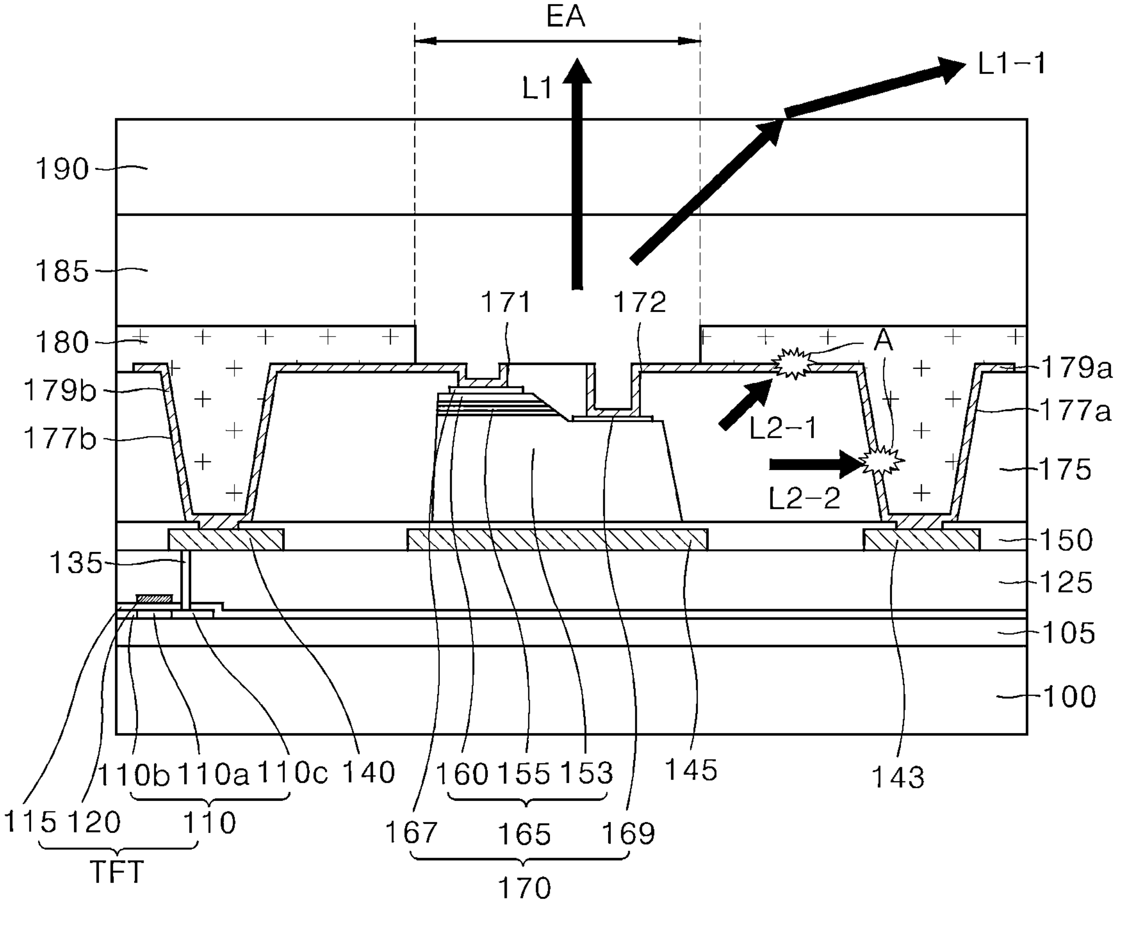
FIG. 1 is a cross-sectional view of a display device according to a first example embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "including," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expressions, such as "at least one of," when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "connected to" another element or layer, it may be directly on, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events, such as "after," "subsequent to," "before," etc., another event may occur therebetween unless "directly after," "directly subsequent" or "directly before" is not indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to" another element or layer, it may be directly on, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the description.

Hereinafter, a display device according to example embodiments of the present disclosure will be described with reference to the accompanying drawings.

FIG. 1 is a cross-sectional view of a display device according to a first example embodiment of the present disclosure.

With reference to FIG. 1, a thin-film transistor TFT driving a light-emitting element is disposed on a substrate 100. The thin-film transistor TFT may include a semiconductor layer 110 formed on the substrate 100, a gate electrode 120 positioned on the semiconductor layer 110, and a gate insulating layer 115 positioned between the semiconductor layer 110 and the gate electrode 120. A buffer insulating layer 105 may be disposed between the substrate 100 and the semiconductor layer 110.

The substrate 100 may include a transparent material, such as glass or plastic. The semiconductor layer 110 may include an active area 110*a* overlapping with the gate electrode 120 to constitute a channel, and a source area 110*b* and a drain area 110*c* respectively located on both opposing sides of the active area 110*a* interposed therebetween.

An interlayer insulating film 125 is disposed on the gate electrode 120. The interlayer insulating film 125 may receive therein a drain electrode 135 extending through the gate insulating layer 115 to be electrically connected to the drain area 110*c*. Further, although not shown in the drawing, the interlayer insulating film 125 may receive therein a source electrode extending through the gate insulating layer 115 to be electrically connected to the source area 110*b*.

A connection electrode 140, a wiring line 143, and a reflective layer 145 may be disposed on the interlayer insulating film 125 and in the same plane. In one example, the wiring line 143 may include a common voltage line.

A protection layer 150 covering the connection electrode 140, the wiring line 143, and the reflective layer 145 is disposed on the interlayer insulating film 125. The protection layer 150 may not cover a portion of an upper surface of each of the connection electrode 140 and the wiring line 143 to be exposed.

A light-emitting element 170 may be disposed on the protection layer 150 at a position corresponding to a position where the reflective layer 145 is disposed. The protection layer 150 may include adhesive material. The light-emitting element 170 may include a micro-LED. The light-emitting element 170 may include a nitride semiconductor structure 165, a first electrode 169, and a second electrode 167.

The nitride semiconductor structure 165 may include a first semiconductor layer 153, an active layer 155 disposed on one side of an upper surface of the first semiconductor layer 153, and the second semiconductor layer 160 disposed on the active layer. The first electrode 169 is disposed on the other side of the upper surface of the first semiconductor layer 153 where the active layer 155 is not located. The second electrode 167 is disposed on the second semiconductor layer 160.

The first semiconductor layer 153 is a layer for supplying electrons to the active layer 155, and may include a nitride semiconductor containing the first conductivity type impurities. For example, the first conductivity-type impurity may include an N-type impurity. The active layer 155 disposed on one side of the upper surface of the first semiconductor layer 153 may have a multi-quantum well (MQW) structure. The second semiconductor layer 160 is a layer for injecting holes into the active layer 155. The second semiconductor layer 160 may include a nitride semiconductor containing the second conductivity type impurity. For example, the second conductivity type impurity may include a P-type impurity.

The reflective layer 145 serves to reflect light beams directed toward the substrate 100 among light beams emitted from the light-emitting element 170 toward the light-emitting area EA.

The light-emitting element 170 may be covered with a first insulating layer 175. The first insulating layer 175 may have a first contact-hole 177*a* and a second contact-hole 177*b* defined therein to expose portions of upper surfaces of the connection electrode 140 and the wiring line 143, respectively. Further, the first insulating layer 175 may have a first opening 172 and a second opening 171 defined therein to expose portions of upper surfaces of the first electrode 169 and the second electrode 167 of the light-emitting element 170, respectively.

A first line electrode 179*a* and a second line electrode 179*b* extend along and on exposed surfaces of the first contact-hole 177*a* and the second contact-hole 177*b*, respectively, and are electrically connected to the wiring line 143 or the drain electrode 135 of the thin-film transistor TFT, respectively.

The first line electrode 179*a* may be connected to the first electrode 169, and extend along and on the exposed surface of the first contact-hole 177*a* to be electrically connected to the wiring line 143. The second line electrode 179*b* may be connected to the second electrode 167 and extend along and on the exposed surface of the second contact-hole 177*b* to be electrically connected to the connection electrode 140 and the drain electrode 135. The first line electrode 179*a* and the second line electrode 179*b* may be made of the same material which may include a transparent metal, such as indium-tin-oxide (ITO), or indium-zinc-oxide (IZO).

A bank 180 having a bank hole defined therein is disposed on the first insulating layer 175 on which the first line electrode 179*a* and the second line electrode 179*b* have been formed. The bank 180 is a boundary area defining the light-emitting area EA, and plays a role in defining each sub-pixel. Remaining portions of the first contact-hole 177*a* and the second contact-hole 177*b* in which the first line electrode 179*a* and the second line electrode 179*b* have been respectively formed may be filled with a material constituting the bank 180. Although not shown in the drawing, a black matrix may be disposed on the bank 180.

A planarization film 185 is disposed on the bank 180. The planarization film 185 may be thick enough to planarize the upper surface having a step caused by the underlying circuit elements. A functional optical film 190 may be disposed on the planarization film 185. For example, the functional optical film 190 may include an anti-scattering film.

The display device according to the first embodiment of the present disclosure may emit light in a top-emission scheme. For example, the top-emission scheme is a scheme in which light L1 generated from the light-emitting element 170 is emitted to a light emitting surface opposite to a position where the substrate 100 is disposed. However, in the top light-emission scheme, the light to be emitted in a frontward direction through the light-emitting area EA is refracted at an interface of the functional optical film 190 and thus is emitted as refracted light L1-1. Thus, luminance of light travelling in the frontward direction is lowered. Further, among the light beams generated from the light-emitting element 170, some light beams L2-1 and L2-2 may not be emitted toward the light-emitting area EA but may be emitted toward a side surface of the light-emitting element 170. As these light beams L2-1 and L2-2 pass through the first and second line electrodes 179*a* and 179*b* composed of the transparent metal oxide and then are absorbed into the bank 180 or the black matrix. Thus, the light output efficiency of the display device is degraded.

Accordingly, in other embodiments of the present disclosure, a display device capable of preventing light efficiency degradation that may occur in the top light-emission scheme, thereby increasing light-emitting efficiency will be described. This will be described with reference to the drawings below.

Figure 2:
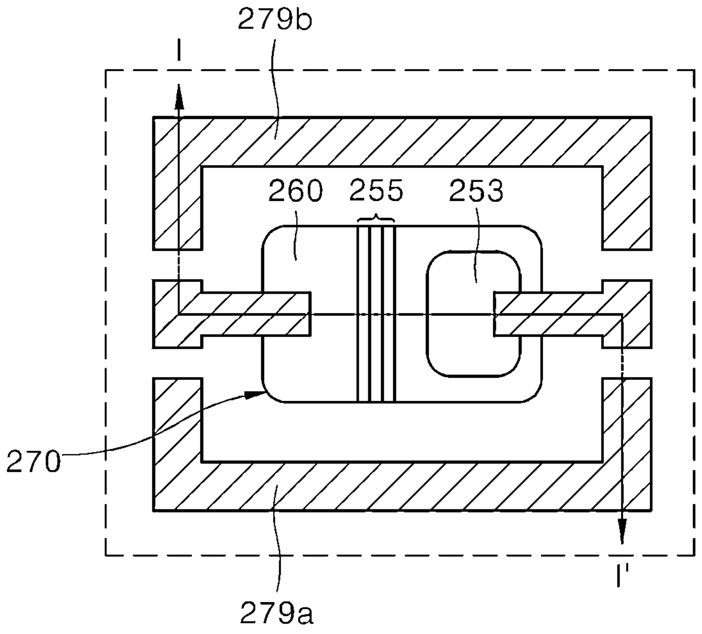
FIG. 2 and FIG. 3 are diagrams of a display device according to a second example embodiment of the present disclosure.
Figure 3:
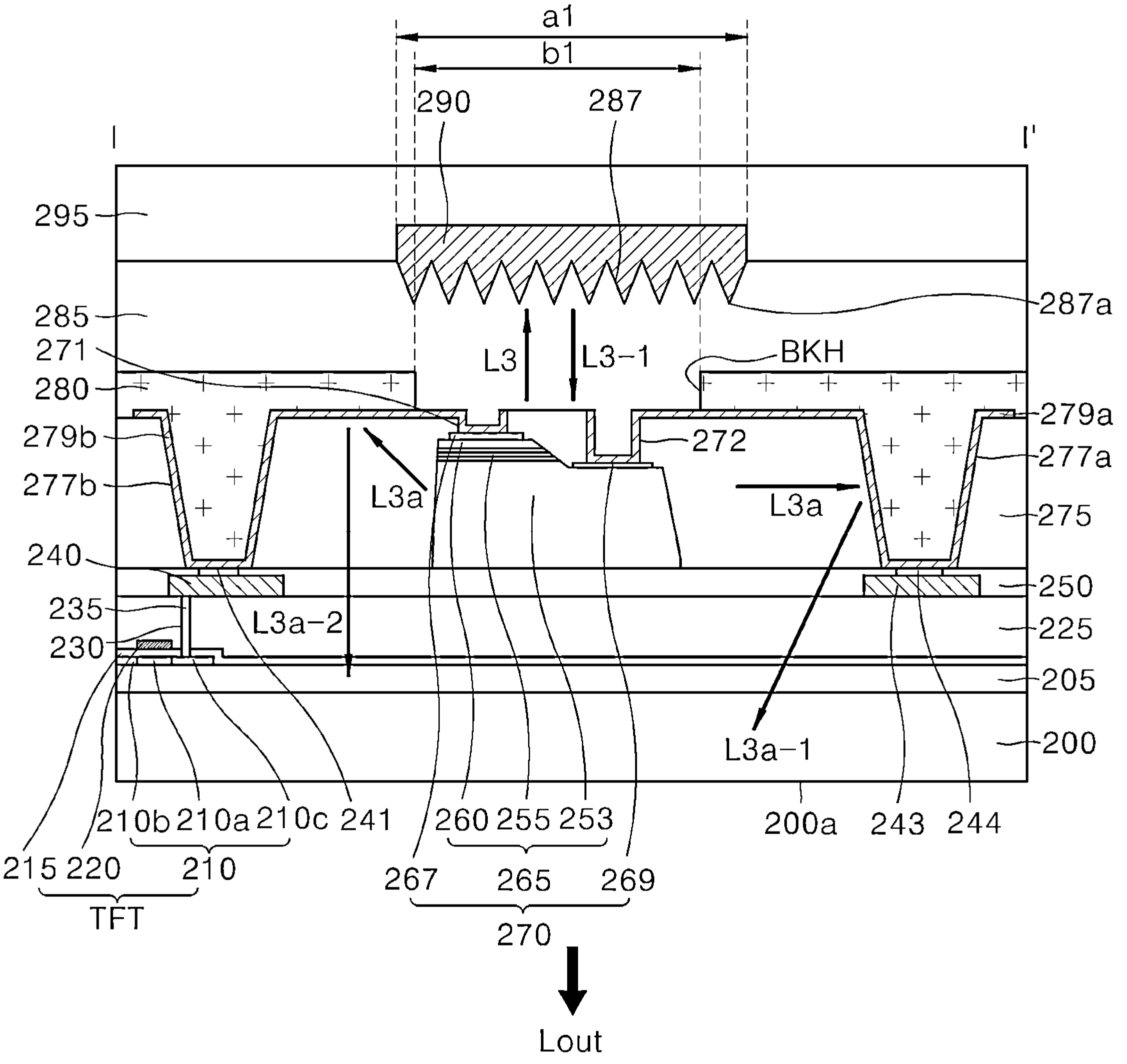

FIG. 2 and FIG. 3 are diagrams of a display device according to a second example embodiment of the present disclosure. In this regard, FIG. 3 is a cross-sectional view of FIG. 2 along a I-I' direction.

With reference to FIG. 2 and FIG. 3, a buffer insulating layer 205 is disposed on a substrate 200. The substrate 200 may include a transparent material including glass or plastic. In this regard, one surface of the substrate 200 may be a light-emitting surface 200*a*. The buffer insulating layer 205 may be disposed on an opposite surface of the substrate 200 to the light-emission surface 200*a* thereof. A thin-film transistor TFT is disposed on the buffer insulating layer 205. A thin-film transistor TFT may include a semiconductor layer 210, a gate insulating film 215, and a gate electrode 220.

The semiconductor layer 210 may include an active area 210*a* overlapping the gate electrode 220 to constitute a channel, and a source area 210*b* and a drain area 210*c* respectively located on both opposing sides of the active area 210*a* interposed therebetween. The gate insulating film 215 is positioned between the semiconductor layer 210 and the gate electrode 220 and may be formed over an entirety of a top surface of the substrate 200.

An interlayer insulating film 225 is disposed on the gate electrode 220. The interlayer insulating film 225 may have a drain contact-hole 230 defined therein extending through the gate insulating layer 215 to expose a portion of a surface of the drain area 210*c* of the semiconductor layer 210. The drain contact-hole 230 may be filled with a conductive material or a metal material to constitute a drain electrode 235 electrically connected to the drain area 210*c*. The drain electrode 235 may apply a signal to the light-emitting element 270.

A connection electrode 240 may be disposed on the interlayer insulating film 225 receiving therein the drain electrode 235. The connection electrode 240 may be electrically connected to the drain electrode 235. A wiring line 243 may be spaced apart from the connection electrode 240. The wiring line 243 may include a common voltage line.

A protection layer 250 protecting the connection electrode 240 and the wiring line 243 is disposed on the interlayer insulating film 225. In the protection layer 250, a first conductive pad 244 and a second conductive pad 241 electrically connecting a reflective electrode to be described later to the underlying circuit elements are disposed. A light-emitting element 270 may be disposed on the protection layer 250. The light-emitting element 270 may include a micro-LED having a size of several μm to several tens of μm. The light-emitting element 270 may include a nitride semiconductor structure 265, a first electrode 269, and a second electrode 267. The nitride semiconductor structure 265 may include a first semiconductor layer 253, an active layer 255 disposed on one side of an upper surface of the first semiconductor layer 253, and the second semiconductor layer 260 disposed on the active layer. The first electrode 269 is disposed on the other side of the upper surface of the first semiconductor layer 253 where the active layer 255 is not located. The second electrode 267 is disposed on the second semiconductor layer 260. In one example, for convenience of illustration, a micro-LED with a specific structure is disposed. However, the present disclosure is not limited to the micro-LED with this specific structure. For example, micro-LEDs having various structures, such as a vertical type micro-LED or a horizontal or lateral type micro-LED, may be applied.

The first semiconductor layer 253 is a layer for supplying electrons to the active layer 255, and may include a nitride semiconductor containing the first conductivity type impurities. For example, the first conductivity-type impurity may include an N-type impurity. The nitride semiconductor may be made of a GaN-based semiconductor material including GaN, AlGaN, InGaN, or AlInGaN. The N-type impurities contained in the first semiconductor layer 253 may include silicon (Si), germanium (Ge), selenium (Se), or carbon (C). The first semiconductor layer 253 may further include an undoped nitride semiconductor layer (undoped GaN) as a lower portion thereof.

The active layer 255 disposed on one side of the top surface of the first semiconductor layer 253 may be a layer for emitting light, and may have a multi-quantum well (MQW) structure having a well layer and a barrier layer having a higher band gap than that of the well layer. For example, the active layer 255 may include an InGaN layer as the well layer and an AlGaN layer as the barrier layer.

The second semiconductor layer 260 is formed on the active layer 255 and is a layer for injecting holes into the active layer 255. The second semiconductor layer 260 may include a nitride semiconductor including the second conductivity type impurity. For example, the second conductivity type impurity may include a P-type impurity. The nitride semiconductor may be made of a GaN-based semiconductor material including GaN, AlGaN, InGaN, or AlInGaN. The P-type impurity contained in the second semiconductor layer 260 may include manganese (Mn), zinc (Zn), or beryllium (Be). In the present disclosure, an example in which the first semiconductor layer 253 and the second semiconductor layer 260 include a nitride semiconductor containing the N-type impurities and a nitride semiconductor containing the P-type impurities, respectively, is described. However, the present disclosure is not limited thereto. In another example, the first semiconductor layer 253 and the second semiconductor layer 260 may include a nitride semiconductor containing the P-type impurity and a nitride semiconductor containing the N-type impurity, respectively.

Each of the first electrode 269 and the second electrode 267 may include at least one metal material, such as gold (Au), tungsten (W), platinum (Pt), iridium (Ir), silver (Ag), copper (Cu), nickel (Ni), titanium (Ti), or chromium (Cr), or an alloy thereof.

The light-emitting element 270 may be covered with a first insulating layer 275. The first insulating layer 275 may receive therein a first contact-hole 277*a* and a second contact-hole 277*b* exposing the first conductive pad 244 and the second conductive pad 241, respectively. Further, the first insulating layer 275 may have a first opening 272 and a second opening 271 defined therein exposing portions of upper surfaces of the first electrode 269 and the second electrode 267 of the light-emitting element 270, respectively. The first insulating layer 275 may include an organic insulating layer, such as photo acryl. However, the present disclosure is not limited thereto. For example, the first insulating layer 275 may include an inorganic insulating layer.

A first reflective electrode 279*a* and a second reflective electrode 279*b* may extend along and on exposed surfaces of the first contact-hole 277*a* and the second contact-hole 277*b*, respectively. Each of the first reflective electrode 279*a* and the second reflective electrode 279*b* may include a metal material having high reflectivity. For example, each of the first reflective electrode 279*a* and the second reflective electrode 279*b* made of a metal material having high reflectivity may have a single-layer structure or a stack structure of multiple layers made of one material selected from aluminum (Al), copper (Cu), silver (Ag), molybdenum (Mo), gold (Au), magnesium (Mg), calcium (Ca), or barium (Ba), or an alloy thereof. In this case, because the first reflective electrode 279*a* and the second reflective electrode 279*b* should reflect the light emitted from the light-emitting element 270, it is desirable that the transparent metal oxide, such as indium-tin-oxide (ITO) or indium-zinc-oxide (IZO), whose reflectance is relatively lower than that of the metal material is not used as the material of each of the first reflective electrode 279*a* and the second reflective electrode 279*b*.

The first reflective electrode 279*a* may be formed along the exposed surface of the first contact-hole 277*a* to be electrically connected to the wiring line 243 via the first conductive pad 244. Further, the first reflective electrode 279*a* may extend along and on an upper surface of the first insulating layer 275 to be connected to the portion of the first electrode 269 exposed through the first opening 272.

The second reflective electrode 279*b* may be formed along the exposed surface of the second contact-hole 277*b* to be electrically connected to the connection electrode 240 and the drain electrode 235 of the thin-film transistor TFT via the second conductive pad 241. Further, the second reflective electrode 279*b* may extend along and on an upper surface of the first insulating layer 275 to be connected to the portion of the second electrode 267 exposed through the second opening 271.

Each of the first reflective electrode 279*a* and the second reflective electrode 279*b* may be formed to surround each of opposing side surfaces of the light-emitting element 270 to increase extraction efficiency of the light emitted from the light-emitting element 270. For example, partial light L3*a* of the light emitted from the light-emitting element 270 may be emitted toward the side surface of the light-emitting element 270. In this case, the light L3*a* may be reflected from each of the first reflective electrode 279*a* and the second reflective electrode 279*b* made of the reflective material and surrounding each of both opposing side surfaces of the light-emitting element 270. In addition, light L3*a*-1 and L3*a*-2 reflected from the first reflective electrode 279*a* or the second reflective electrode 279*b*, respectively may be directed toward the light-emission surface 200*a* of the substrate 200 and then may be emitted (Lout) to the outside.

A bank 280 having a bank-hole BKH defined therein is disposed on the first insulating layer 275 on which the first reflective electrode 279*a* and the second reflective electrode 279*b* have been formed. The bank 280 serves to define each sub-pixel. The bank-hole BKH may expose a light-emitting area of the light-emitting element 270. In one example, the bank-hole BKH may expose a light-emitting area of a top surface of the light-emitting element 270. Remaining portions of the first contact-hole 277*a* and the second contact-hole 277*b* in which the first reflective electrode 279*a* and the second reflective electrode 279*b* are respectively formed may be filled with a material constituting the bank 280.

On the bank 280, a first planarization film 285 is disposed. The first planarization film 285 may have a groove pattern 287 formed therein and located in an area corresponding to the bank-hole BKH, wherein the groove pattern includes a plurality of recesses 287*a*. The groove pattern 287 may have a shape in which the recesses 287*a* are consecutively and repeatedly arranged and are connected to each other. The groove pattern 287 including the recesses 287*a* may have a regular pattern shape in which adjacent recesses 287*a* have the same depth and the same width. Each of the recesses 287*a* may include an inclined side surface. In one example, the recess 287*a* may be referred to as a valley.

An upper reflective layer 290 is disposed on the groove pattern 287. The upper reflective layer 290 may be formed to have a thickness sufficient such that the upper reflective layer 290 entirely fills the recesses 287*a* of the groove pattern 287 and an upper surface of the upper reflective layer 290 is located at a level higher than a level of an upper surface of the first planarization film 285.

The upper reflective layer 290 is formed along a profile of the groove pattern 287. Accordingly, a lower surface of the upper reflective layer 290 may have a shape in which the recesses 287*a* are consecutively arranged in one direction. In other words, the upper reflective layer 290 includes a plurality of protrusion patterns protruding toward the substrate 200. In addition, as the protrusion patterns are formed along the profile of the groove pattern 287, the plurality of protrusions having the same width and the same depth may be consecutively arranged in one direction.

The upper reflective layer 290 may include a metal material with high reflectivity, and may be made of the same material as that of each of the first reflective electrode 279*a* and the second reflective electrode 279*b*. The upper reflective layer 290 may have a width al larger than a width b1 of the bank-hole BKH. The upper reflective layer 290 may reflect light L3 emitted from the light-emitting element 270 in an upward direction opposite to a downward direction toward the light-emission surface 200*a* of the substrate 200 such that reflected light L3-1 is directed toward the light-emission surface 200*a* of the substrate 200. This may increase an amount of light emitted in the frontward direction such that the luminance of light travelling in the frontward direction of the light-emitting element 270 may be improved.

A second planarization film 295 is formed on the first planarization film 285 and the upper reflective layer 290. The second planarization film 295 may be thick enough to planarize the upper surface thereof. Each of the first planarization film 280 and the second planarization film 295 may include an organic insulating layer, such as a photo acryl layer. However, the present disclosure is not limited thereto. For example, each of the first planarization film 285 and the second planarization film 295 may include an inorganic insulating layer.

The display device according to the second embodiment of the present disclosure operates in a bottom-emission scheme in which light L3 and L3*a* generated from the light-emitting element 270 are emitted toward the substrate 200. Accordingly, a functional optical film may be disposed on an upper surface of the substrate 200. For example, the functional optical film may include an anti-scattering film.

In the display device operating in the bottom-emission scheme according to the present disclosure, the first reflective electrode, the second reflective electrode and the upper reflective layer may be introduced to increase the light output efficiency at which light is emitted toward the substrate and increase an amount of light emitted in a frontward direction of the substrate, thereby improving the luminance of light travelling in the frontward direction of the light-emitting element.

Further, the light output efficiency may be further improved by scattering the light emitted from the light-emitting element to further increase the amount of light. This will be described with reference to the drawings below.

Figure 4:
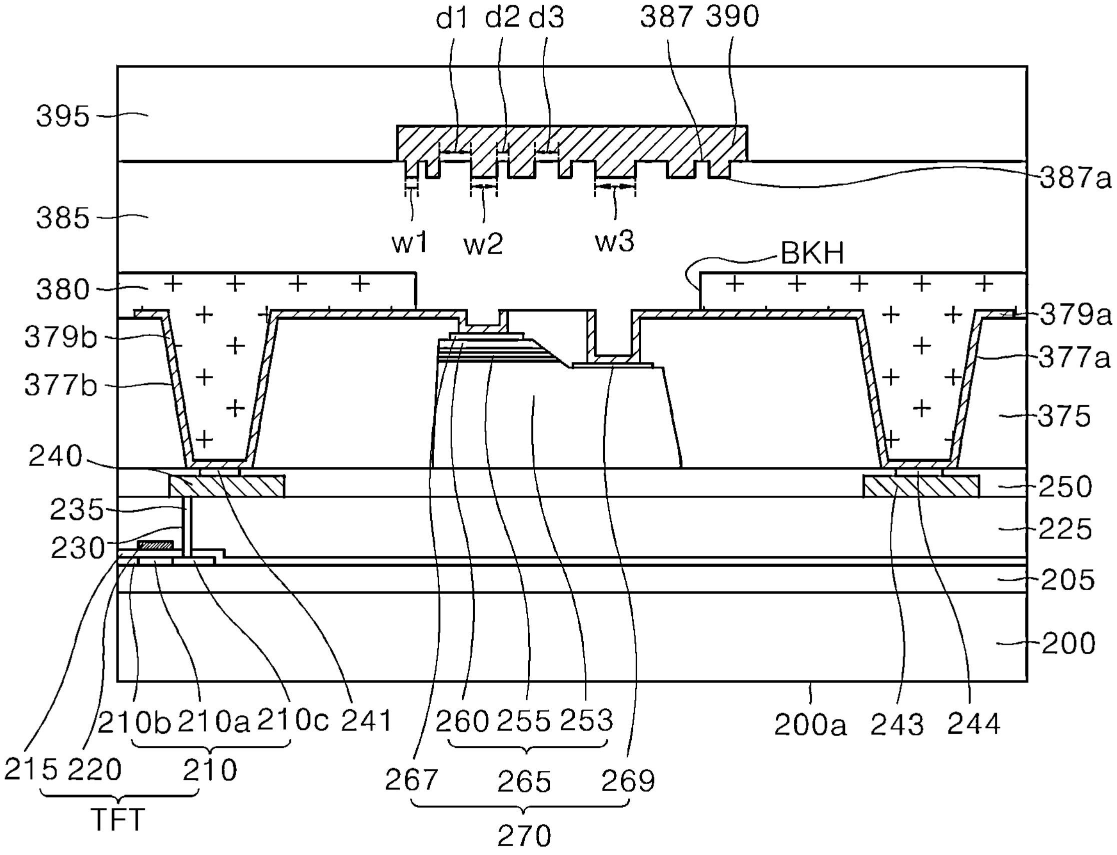
FIG. 4 is a cross-sectional view of a display device according to a third example embodiment of the present disclosure.

FIG. 4 is a cross-sectional view of a display device according to a third example embodiment of the present disclosure.

In FIG. 4, the buffer insulating layer 205 is disposed on a surface opposite to the light-emission surface 200*a* of the substrate 200. The thin-film transistor TFT is disposed on the buffer insulating layer 205. The thin-film transistor TFT may include the semiconductor layer 210, the gate insulating film 215, and the gate electrode 220. In this regard, the components marked with the same reference numerals as those in FIG. 2 will be briefly described, and following descriptions are based on differences therebetween.

The interlayer insulating film 225 is disposed on the gate electrode 220 of the thin-film transistor TFT. The interlayer insulating film 225 may receive therein the drain electrode 235 extending through the gate insulating layer 215 to be electrically connected to the drain area 210*c*. The drain electrode 235 may apply a signal to the light-emitting element 270. The connection electrode 240 electrically connected to the drain electrode 235 may be disposed on the interlayer insulating film 225. The wiring line 243 may be spaced apart from the connection electrode 240. The wiring line 243 may include a common voltage line.

The protection layer 250 in which the first conductive pad 244 connected to the wiring line 243, and the second conductive pad 241 connected to the connection electrode 240 is disposed may be disposed on the interlayer insulating film 225.

The light-emitting element 270 may be disposed on the protection layer 250. The light-emitting element 270 may include the micro-LED having the size of several μm to several tens of μm. The light-emitting element 270 may include the nitride semiconductor structure 265, the first electrode 269, and the second electrode 267. The nitride semiconductor structure 265 may include the first semiconductor layer 253, an active layer 255 disposed on one side of an upper surface of the first semiconductor layer 253, and the second semiconductor layer 260 disposed on the active layer. The first electrode 269 is disposed on the other side of the upper surface of the first semiconductor layer 253 where the active layer 255 is not located. The second electrode 267 is disposed on the second semiconductor layer 260.

The first semiconductor layer 253 is the layer for supplying electrons to the active layer 255, and may include the nitride semiconductor containing the first conductivity type impurities. For example, the first conductivity-type impurity may include an N-type impurity. The nitride semiconductor may be made of the GaN-based semiconductor material including GaN, AlGaN, InGaN, or AlInGaN. The N-type impurities contained in the first semiconductor layer 253 may include silicon (Si), germanium (Ge), selenium (Se), or carbon (C). The first semiconductor layer 253 may further include an undoped nitride semiconductor layer (undoped GaN) as the lower portion thereof. The active layer 255 disposed on one side of the top surface of the first semiconductor layer 253 may be the layer for emitting light, and may have the multi-quantum well (MQW) structure having the well layer and the barrier layer having the higher band gap than that of the well layer. For example, the active layer 255 may include an InGaN layer as the well layer and an AlGaN layer as the barrier layer. The active layer 255 may emit light based on recombination of electrons and holes respectively supplied from the first semiconductor layer 253 and the second semiconductor layer 260. The second semiconductor layer 260 may include the nitride semiconductor containing the second conductivity type impurity. For example, the second conductivity type impurity may include a P-type impurity. In the present disclosure, an example in which the first semiconductor layer 253 and the second semiconductor layer 260 include the nitride semiconductor containing the N-type impurities and the nitride semiconductor containing the P-type impurities, respectively, is described. However, the present disclosure is not limited thereto. In another example, the first semiconductor layer 253 and the second semiconductor layer 260 may include the nitride semiconductor containing the P-type impurity and the nitride semiconductor containing the N-type impurity, respectively.

The light-emitting element 270 may be covered with a first insulating layer 375. The first insulating layer 375 may receive therein a first contact-hole 377*a* and a second contact-hole 377*b* exposing the first conductive pad 244 and the second conductive pad 241, respectively. The first insulating layer 375 may include an organic insulating layer, such as photo acryl.

A first reflective electrode 379*a* and a second reflective electrode 379*b* may extend along and one exposed surfaces of the first contact-hole 377*a* and the second contact-hole 377*b*, respectively. Each of the first reflective electrode 379*a* and the second reflective electrode 379*b* may include a metal material with high reflectivity. Each of the first reflective electrode 379*a* and the second reflective electrode 379*b* made of the metal material with high reflectivity may have the single-layer structure or the stack structure of multiple layers made of one material selected from aluminum (Al), copper (Cu), silver (Ag), molybdenum (Mo), gold (Au), magnesium (Mg), calcium (Ca), or barium (Ba), or an alloy thereof. In this case, because the first reflective electrode 379*a* and the second reflective electrode 379*b* should reflect the light emitted from the light-emitting element 270, it is desirable that the transparent metal oxide, such as indium-tin-oxide (ITO) or indium-zinc-oxide (IZO), whose reflectance is relatively lower than that of the metal material is not used as the material of each of the first reflective electrode 379*a* and the second reflective electrode 379*b*.

One end of the first reflective electrode 379*a* may be formed along and on the exposed surface of the first contact-hole 377*a* and may be connected to the wiring line 243 via the first conductive pad 244, while the other end thereof may be connected to the first electrode 269. One end of the second reflective electrode 379*b* may be formed along and on the exposed surface of the second contact-hole 377*b* and may be connected to the connection electrode 240 and the drain electrode 235 via the second conductive pad 241, while the other end thereof may be connected to the second electrode 267.

Each of the first reflective electrode 379*a* and the second reflective electrode 379*b* may be formed to surround each of opposing side surfaces of the light-emitting element 270 to increase extraction efficiency of the light emitted from the light-emitting element 270. In one example, the light emitted toward the side surface of the light-emitting element 270 and the totally internally reflected light may be reflected from the first reflective electrode 379*a* and the second reflective electrode 379*b* and then may be directed to the light-emission surface 200*a* of the substrate 200.

The bank 380 having the bank-hole BKH defined therein is disposed on the first insulating layer 375 on which the first reflective electrode 379*a* and the second reflective electrode 379*b* have been formed. The bank 380 serves to define each sub-pixel. The bank-hole BKH may expose the light-emitting area of the light-emitting element 270. In one example, the bank-hole BKH may expose the light-emitting area of the top surface of the light-emitting element 270. Remaining portions of the first contact-hole 377*a* and the second contact-hole 377*b* in which the first reflective electrode 379*a* and the second reflective electrode 379*b* are respectively formed may be filled with the material constituting the bank 380.

On the bank 380, a first planarization film 385 is disposed. The first planarization film 385 may have the groove pattern 387 formed therein and located in an area corresponding to the bank-hole BKH, wherein the groove pattern includes the plurality of recesses 387*a*. The groove pattern 387 may have the shape in which the recesses 387*a* are arranged irregularly. The groove pattern 387 may have a shape in which the plurality of recesses 387*a* are arranged such that the plurality of recesses 387*a* have different widths w1, w2, and w3, and distances d1, d2, and d3 between adjacent recesses 387*a* are different from each other. Further, the plurality of recesses 387*a* may have different depths.

The upper reflective layer 390 is disposed on the groove pattern 387. The upper reflective layer 390 may be formed to have the thickness sufficient such that the upper reflective layer 390 entirely fills the recesses 387*a* of the groove pattern 387, and an upper surface of the upper reflective layer 390 is located at the level higher than the level of an upper surface of the first planarization film 385. The upper reflective layer 390 is formed along the profile of the groove pattern 387. In other words, the upper reflective layer 390 includes the plurality of protrusion patterns protruding toward the substrate 200. In addition, as the protrusion patterns are formed along the profile of the groove pattern 387, the plurality of protrusions having the different widths and the different depths may be irregularly arranged in one direction.

As the upper reflective layer 390 is formed along the profile of the groove pattern 387, a lower surface thereof may have an irregular surface shape. The upper reflective layer 390 may include the same material as that of each of the first reflective electrode 379*a* and the second reflective electrode 379*b*.

The upper reflective layer 390 may be formed to have a width larger than a width of the bank-hole BKH. The upper reflective layer 390 serves to reflect light upwardly emitted from the light-emitting element 270 to be directed toward the light-emission surface 200*a* of the substrate 200. In this regard, the upper reflective layer 390 has the irregular lower surface shape. Accordingly, as a larger amount of the light is scattered at the irregular surface of the upper reflective layer 390 and is reflected therefrom, an amount of reflected light may increase. Accordingly, an amount of light emitted in a frontward direction of the substrate 200 may be increased, such that luminance of light travelling in the frontward direction of the light-emitting element may be improved.

A second planarization film 395 is formed on the first planarization film 385 and the upper reflective layer 390. The second planarization film 395 may be thick enough to planarize the upper surface thereof. Each of the first planarization film 385 and the second planarization film 395 may include an organic insulating layer, such as the photo acryl layer. However, the present disclosure is not limited thereto. For example, each of the first planarization film 385 and the second planarization film 395 may include an inorganic insulating layer.

In the display device according to the third embodiment of the present disclosure transmits, the light emitted toward the side surface of the light-emitting element 270 and the totally internally reflected light may be reflected from the first reflective electrode 379*a* and the second reflective electrode 379*b* and then may be directed to the light-emission surface 200*a* of the substrate 200. Further, the light may be scattered at the irregular surface shape of the upper reflective layer 390 disposed above the light-emitting element 270, and the light emitted upwardly may be reflected from the upper reflective layer 390 and then may be emitted toward the substrate. Accordingly, the amount of light emitted in the frontward direction increases, such that the luminance of light travelling in the frontward direction of the light-emitting element may be improved.

Figure 5:
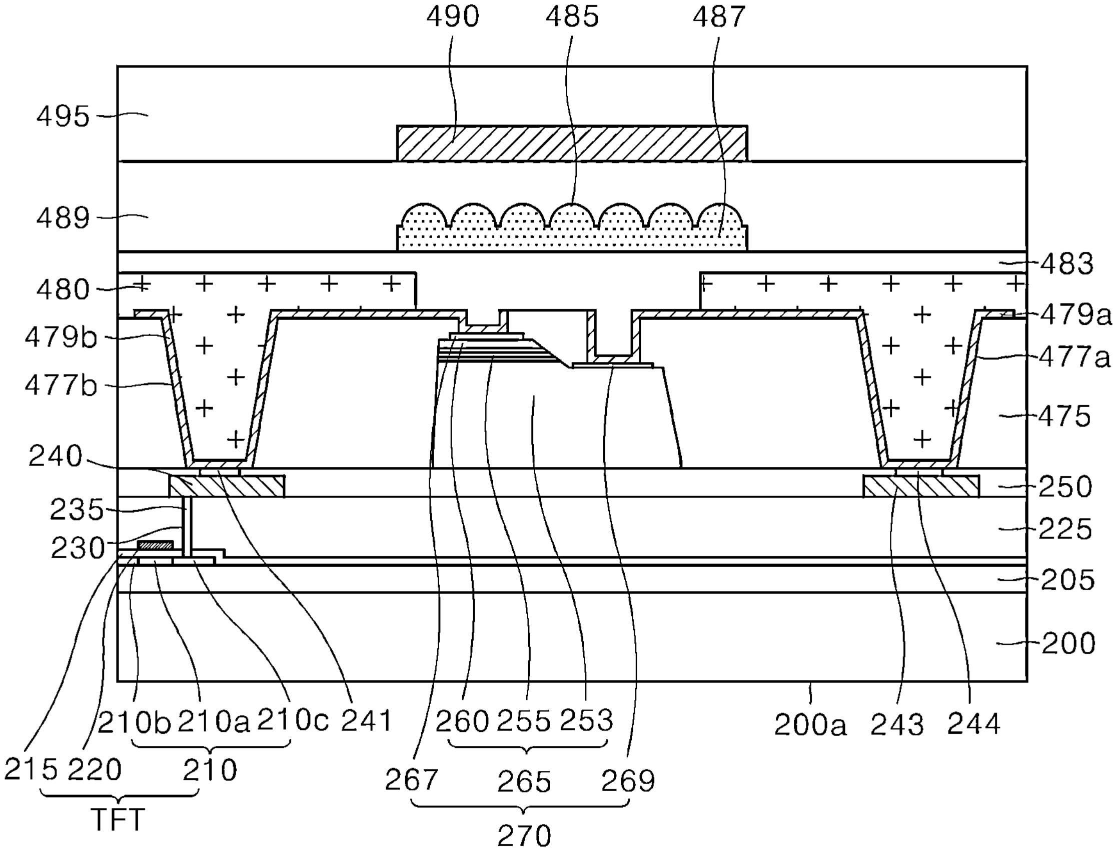
FIG. 5 is a cross-sectional view of a display device according to a fourth example embodiment of the present disclosure.

FIG. 5 is a cross-sectional view of a display device according to a fourth example embodiment of the present disclosure.

As illustrated in FIG. 5, the buffer insulating layer 205 is disposed on the surface opposite to the light-emission surface 200*a* of the substrate 200. The thin-film transistor TFT is disposed on the buffer insulating layer 205. The thin-film transistor TFT may include the semiconductor layer 210, the gate insulating film 215, and the gate electrode 220. In this regard, the components marked with the same reference numerals as those in FIG. 2 will be briefly described, and following descriptions are based on differences therebetween.

The interlayer insulating film 225 is disposed on the gate electrode 220 of the thin-film transistor TFT. The interlayer insulating film 225 may receive therein the drain electrode 235 extending through the gate insulating layer 215 to be electrically connected to the drain area 210*c*. The drain electrode 235 may apply a signal to the light-emitting element 270. The connection electrode 240 electrically connected to the drain electrode 235 may be disposed on the interlayer insulating film 225. The wiring line 243 may be spaced apart from the connection electrode 240. The wiring line 243 may include a common voltage line.

The protection layer 250 in which the first conductive pad 244 connected to the wiring line 243, and the second conductive pad 241 connected to the connection electrode 240 is disposed may be disposed on the interlayer insulating film 225.

The light-emitting element 270 may be disposed on the protection layer 250. The light-emitting element 270 may include the nitride semiconductor structure 265, the first electrode 269, and the second electrode 267. The nitride semiconductor structure 265 may include the first semiconductor layer 253, an active layer 255 disposed on one side of an upper surface of the first semiconductor layer 253, and the second semiconductor layer 260 disposed on the active layer. The first electrode 269 is disposed on the other side of the upper surface of the first semiconductor layer 253 where the active layer 255 is not located. The second electrode 267 is disposed on the second semiconductor layer 260.

The light-emitting element 270 may be covered with a first insulating layer 475. The first insulating layer 475 may receive therein a first contact-hole 477*a* and a second contact-hole 477*b* exposing the first conductive pad 244 and the second conductive pad 241, respectively. The first insulating layer 475 may include an organic insulating layer, such as photo acryl. A first reflective electrode 479*a* and a second reflective electrode 479*b* may extend along and one exposed surfaces of the first contact-hole 477*a* and the second contact-hole 477*b*, respectively. Each of the first reflective electrode 479*a* and the second reflective electrode 479*b* may include a metal material with high reflectivity. Each of the first reflective electrode 479*a* and the second reflective electrode 479*b* made of the metal material with high reflectivity may have the single-layer structure or the stack structure of multiple layers made of one material selected from aluminum (Al), copper (Cu), silver (Ag), molybdenum (Mo), gold (Au), magnesium (Mg), calcium (Ca), or barium (Ba), or an alloy thereof. In this case, because the first reflective electrode 479*a* and the second reflective electrode 479*b* should reflect the light emitted from the light-emitting element 270, it is desirable that the transparent metal oxide such as indium-tin-oxide (ITO) or indium-zinc-oxide (IZO) whose reflectance is relatively lower than that of the metal material is not used as the material of each of the first reflective electrode 479*a* and the second reflective electrode 479*b*.

One end of the first reflective electrode 479*a* may be formed along and on the exposed surface of the first contact-hole 477*a* and may be connected to the wiring line 243 via the first conductive pad 244, while the other end thereof may be connected to the first electrode 269. One end of the second reflective electrode 479*b* may be formed along and on the exposed surface of the second contact-hole 477*b* and may be connected to the connection electrode 240 and the drain electrode 235 via the second conductive pad 241, while the other end thereof may be connected to the second electrode 267.

Each of the first reflective electrode 479*a* and the second reflective electrode 479*b* may be formed to surround each of opposing side surfaces of the light-emitting element 270 to increase extraction efficiency of the light emitted from the light-emitting element 270. In one example, the light emitted toward the side surface of the light-emitting element 270 and the totally internally reflected light may be reflected from the first reflective electrode 479*a* and the second reflective electrode 479*b* and then may be directed to the light-emission surface 200*a* of the substrate 200.

A bank 480 having the bank-hole BKH defined therein is disposed on the first insulating layer 475 on which the first reflective electrode 479*a* and the second reflective electrode 479*b* have been formed. The bank 480 serves to define each sub-pixel. The bank-hole BKH may expose the light-emitting area of the light-emitting element 270. In one example, the bank-hole BKH may expose the light-emitting area of the top surface of the light-emitting element 270. Remaining portions of the first contact-hole 477*a* and the second contact-hole 477*b* in which the first reflective electrode 479*a* and the second reflective electrode 479*b* are respectively formed may be filled with the material constituting the bank 480.

On the bank 480, a first planarization film 483 is disposed. The first planarization film 483 serves to cover an upper surface of the bank 480 and the exposed surfaces of the first reflective electrode 479*a* and the second reflective electrode 479*b* exposed through the bank-hole BKH. The first planarization film 483 may include an organic insulating layer, such as a photo acryl layer.

A high refractive index pattern 487 having a higher refractive index than that of the first planarization film 483 may be disposed on the first planarization film 483. The high refractive index pattern 487 has a shape in which a plurality of convex portions 485 are consecutively and repeatedly arranged and are connected to each other. In one example, the convex portion 485 may also be referred to as a peak. The high refractive index pattern 487 may include a resin.

A second planarization film 489 may be disposed on the high refractive index pattern 487. The second planarization film 489 may be formed to have a thickness sufficient to planarize a curved surface caused by the convex portions 485 of the high refractive index pattern 487. An upper reflective layer 490 is disposed on the second planarization film 489. The upper reflective layer 490 may be formed to have a plate shape with a flat surface.

The upper reflective layer 490 may be disposed at a position corresponding to a position where the high refractive index pattern 487 is disposed, and may be formed to have at least the same width as that of the high refractive index pattern 487. Further, the upper reflective layer 490 may be formed to have a width larger than a width of the bank-hole BKH. The upper reflective layer 490 may include the same material as a material of each of the first reflective electrode 479*a* and the second reflective electrode 479*b*.

The high refractive index pattern 487 disposed between the upper reflective layer 490 and the light-emitting element 270 may refract light emitted from the light-emitting element 270 to be directed toward the upper reflective layer 490. Then, the upper reflective layer 490 serves to reflect light as refracted at the high refractive index pattern 487 to be incident thereto such that the reflected light is directed to the light-emission surface 200*a* of the substrate 200. Accordingly, the amount of light emitted in a frontward direction may be increased, and thus luminance of light in a frontward direction of the light-emitting element 270 may be improved.

A third planarization film 495 is formed on the upper reflective layer 490 and the second planarization film 489. The third planarization film 495 may be thick enough to planarize an upper surface thereof. The first planarization film 483, the second planarization film 489, and the third planarization film 495 may include the same material. In one example, each of the first planarization film 483, the second planarization film 489, and the third planarization film 495 may include an organic insulating layer, such as a photo acryl layer. However, the present disclosure is not limited thereto. For example, each of the first planarization film 483, the second planarization film 489, and the third planarization film 495 may include an inorganic insulating layer or may include a structure in which organic insulating layers and inorganic insulating layers are alternately stacked with each other.

A display device according to the fourth embodiment of the present disclosure operates in the bottom-emission scheme in which light generated from the light-emitting element 270 is emitted toward the substrate 200. In this case, introducing the first reflective electrode, the second reflective electrode, the high refractive index pattern and the upper reflective layer may allow the light output efficiency at which light is emitted toward the substrate to be increased. Further, the high refractive index pattern disposed between the light-emitting element and the upper reflective layer may refract the light to be directed to the upper reflective layer disposed in the frontward direction of the light-emitting element regardless of the direction of the light emitted from the light-emitting element. Then, the upper reflective layer reflects the light to be directed in a frontward direction of the substrate, thereby improving luminance of light in a frontward direction of the light-emitting element.

Figure 6:
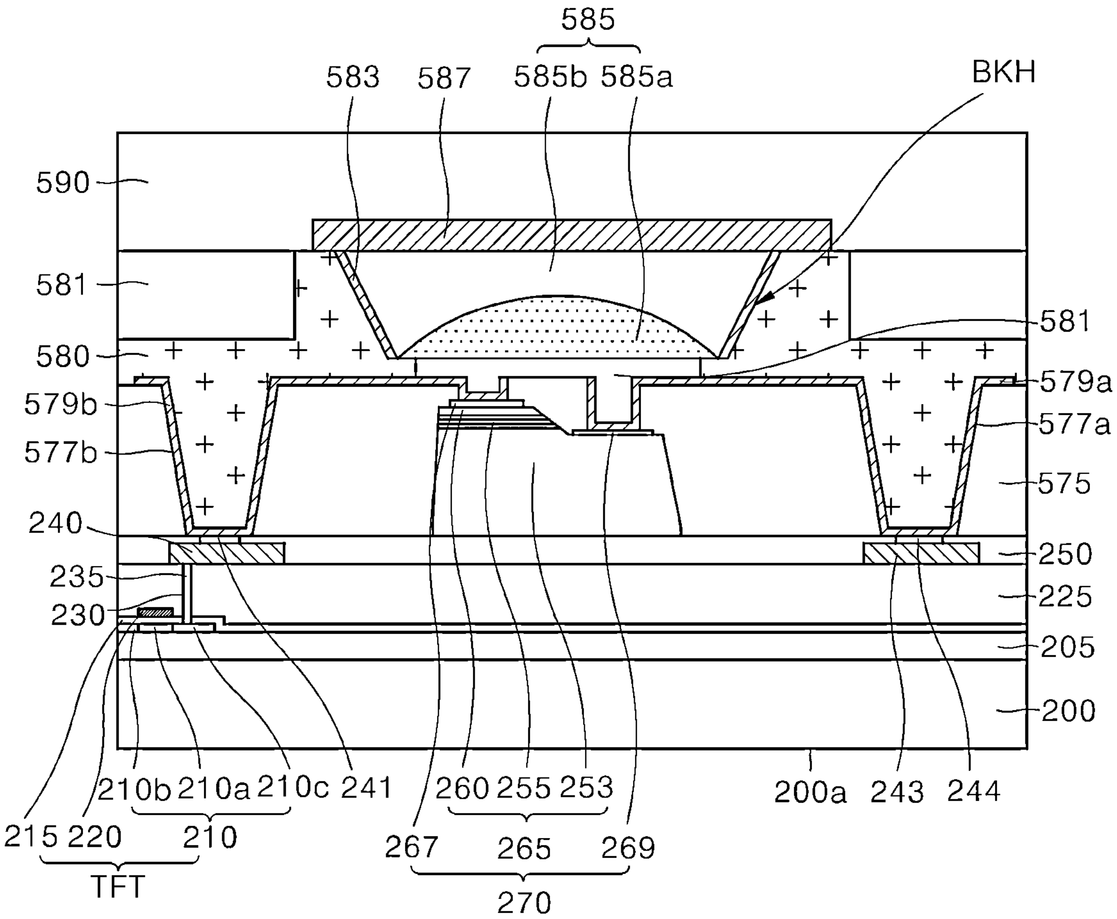
FIG. 6 is a cross-sectional view of a display device according to a fifth example embodiment of the present disclosure.

FIG. 6 is a cross-sectional view of a display device according to a fifth example embodiment of the present disclosure. FIG. 7A to FIG. 8C are diagrams shown to illustrate an operation of the display device.

As shown in FIG. 6, the light-emitting element 270 including a micro-LED is disposed on the opposite surface of the substrate 200 opposite to the light-emission surface 200*a* of the substrate 200. A lower circuit element including the thin-film transistor TFT is formed on the opposite surface of the substrate 200. In this regard, the components marked with the same reference numerals as those in FIG. 2 will be briefly described, and following descriptions are based on differences therebetween.

The light-emitting element 270 may include the nitride semiconductor structure 265, the first electrode 269, and the second electrode 267. The nitride semiconductor structure 265 may include the first semiconductor layer 253, the active layer 255 disposed on one side of an upper surface of the first semiconductor layer 253, and the second semiconductor layer 260 disposed on the active layer.

The light-emitting element 270 may be covered with a first insulating layer 575. The first insulating layer 575 may have a first contact-hole 577*a* and a second contact-hole 577*b* defined therein exposing the first conductive pad 244 and the second conductive pad 241, respectively. Further, the first insulating layer 575 may not cover portions of surfaces of the first electrode 269 and the second electrode 267 of the light-emitting element 270 to be exposed.

A first reflective electrode 579*a* and a second reflective electrode 579*b* are respectively disposed on exposed surfaces of the first contact-hole 577*a* and the second contact-hole 577*b*. Each of the first reflective electrode 579*a* and the second reflective electrode 579*b* may include a metal material with high reflectivity. The first reflective electrode 579*a* may be formed along and on the exposed surface of the first contact-hole 577*a* to be electrically connected to the wiring line 243 via the first conductive pad 244. Further, the first reflective electrode 579*a* may be connected to the first electrode 269. The second reflective electrode 579*b* may be formed along and on the exposed surface of the second contact-hole 577*b* to be electrically connected to the connection electrode 240 and the drain electrode 235 via the second conductive pad 241. Further, the second reflective electrode 579*b* may extend along and on an upper surface of the first insulating layer 575 to be connected to the second electrode 567.

Each of the first reflective electrode 579*a* and the second reflective electrode 579*b* are formed to surround each of both opposing side surfaces of the light-emitting element 270. The light emitted toward the side surface of the light-emitting element 270 and the totally internally reflected light may be reflected from each of the first reflective electrode 579*a* and the second reflective electrode 579*b* to be directed to the substrate 200. Accordingly, the display device according to the fifth embodiment of the present disclosure operates in a bottom-emission scheme in which light generated from the light-emitting element 270 is emitted toward the substrate 200.

A bank 580 having a bank-hole BKH defined therein is disposed on the first insulating layer 575 on which the first reflective electrode 579*a* and the second reflective electrode 579*b* have been formed. The bank-hole BKH according to the fifth embodiment of the present disclosure may include both opposing inclined side surfaces extending in an inclined manner with respect to a surface of the substrate 200. Accordingly, the bank-hole BKH may have a concave trench shape including both opposing inclined sidewalls and a bottom surface. Remaining portions of the first contact-hole 577*a* and the second contact-hole 577*b* may be filled with a material constituting the bank 580. Due to the bank-hole BKH having the concave trench shape, an upper surface of the bank 580 may be located at a level higher than a level of a top surface of each of the first contact-hole 577*a* and the second contact-hole 577*b* and may be formed to have a stepped shape.

A first planarization film 581 is disposed on the bank 580. An upper surface of the first planarization film 581 may be coplanar with the stepped upper surface of the bank 580. A sidewall reflective electrode 583 may be disposed on each of both opposing sidewalls of the bank-hole BKH having the trench shape. The sidewall reflective electrode 583 may have a shape surrounding an inner side surface of the bank-hole BKH having the trench shape. The bank-hole BKH may be filled with a liquid lens 585. The liquid lens 585 may include a transparent insulating liquid 585*a* and a conductive liquid 585*b* disposed on the transparent insulating liquid 585*a*. The transparent insulating liquid 585*a* may be made of a material that is immiscible with the conductive liquid 585*b*, and may include, for example, silicon (Si) oil. The conductive liquid 585*b* disposed on the transparent insulating liquid 525*a* may include an electrolyte. The electrolyte may include a material including a salt, such as ammonium chloride ($NH_4Cl$), sodium chloride (NaCl) or potassium chloride (KCl).

In one example, the first planarization film 581 may be disposed between the light-emitting element 270 and the liquid lens 585 to isolate the light-emitting element 270 from the liquid lens 585.

An upper reflective layer 587 may be disposed on the first planarization film 581 and the liquid lens 585. The upper reflective layer 587 may be located on the bank-hole BKH filled with the liquid lens 585. The upper reflective layer 587 may include a metal material with high reflectivity, and may include the same material as that of each of the first reflective electrode 579*a* and the second reflective electrode 579*b*. The upper reflective layer 587 may have a width larger than a width of the bank-hole BKH. The upper reflective layer 587 reflects the light emitted in the upward direction from the light-emitting element 270 to be directed toward the substrate 200.

The liquid lens 585 has a flat surface before voltage is applied thereto, and has no change in optical characteristics thereof. However, when the voltage is applied thereto, the liquid lens 585 is deformed to have a convex surface to change a light path. At the same time when the voltage is applied to the light-emitting element 270, voltage is also applied to the liquid lens 585 to operate.

Figure 7A:
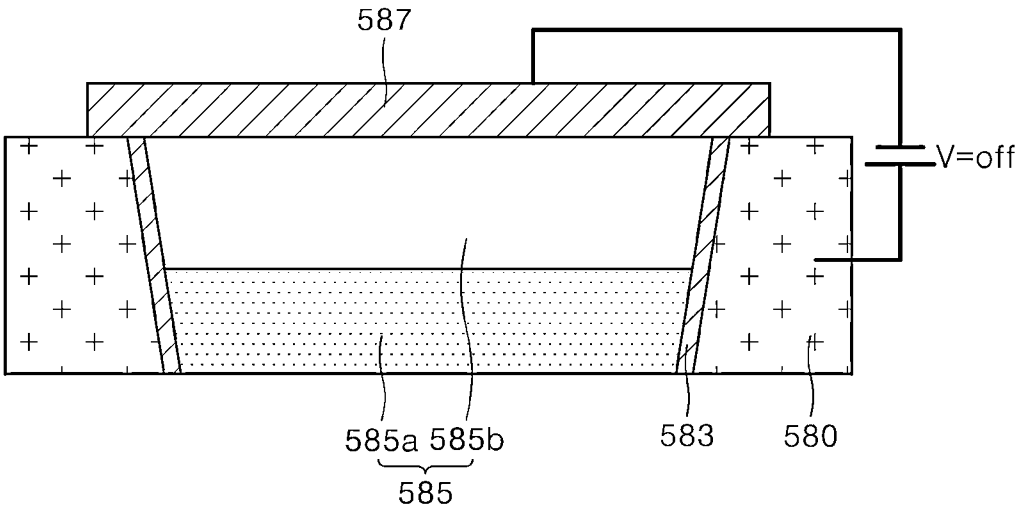
FIG. 7A to FIG. 8C are diagrams shown to illustrate an operation of a display device.
Figure 7B:
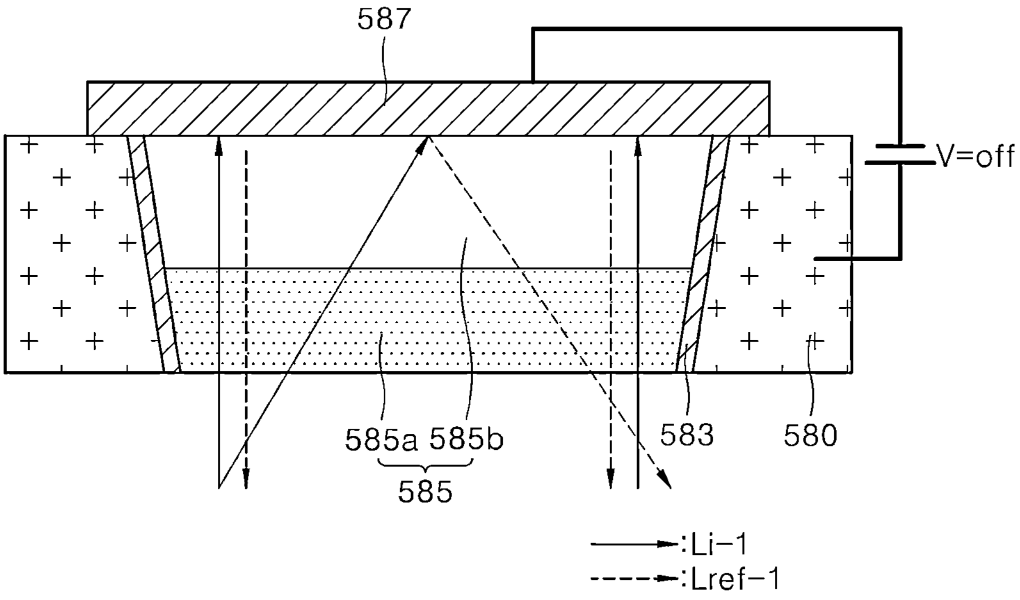

For example, as shown in FIGS. 7A and 7B, when no voltage is applied to the light-emitting element 270 (V=OFF), the liquid lens 585 has a flat surface. When light Li-1 is incident on the liquid lens 585 while the liquid lens 585 has the flat surface, the incident light Li-1 transmits through the transparent insulating liquid 585*a* of the liquid lens 585 and the conductive liquid 585*b* of the liquid lens 585 disposed on the transparent insulating liquid 585*a* and then is incident onto the upper reflective layer 587 and is then reflected from the upper reflective layer 587. Light Lref-1 reflected from the upper reflective layer 587 may be directed in a frontward direction of the substrate 200 and then may be emitted to the outside. However, the light Lref-1 reflected from the upper reflective layer 587 may be directed in a direction other than the frontward direction of the substrate 200. Thus, there is no change in the optical characteristics of the display device. In particular, the luminance of light in the frontward direction of the light-emitting element may not be affected.

Figure 7C:
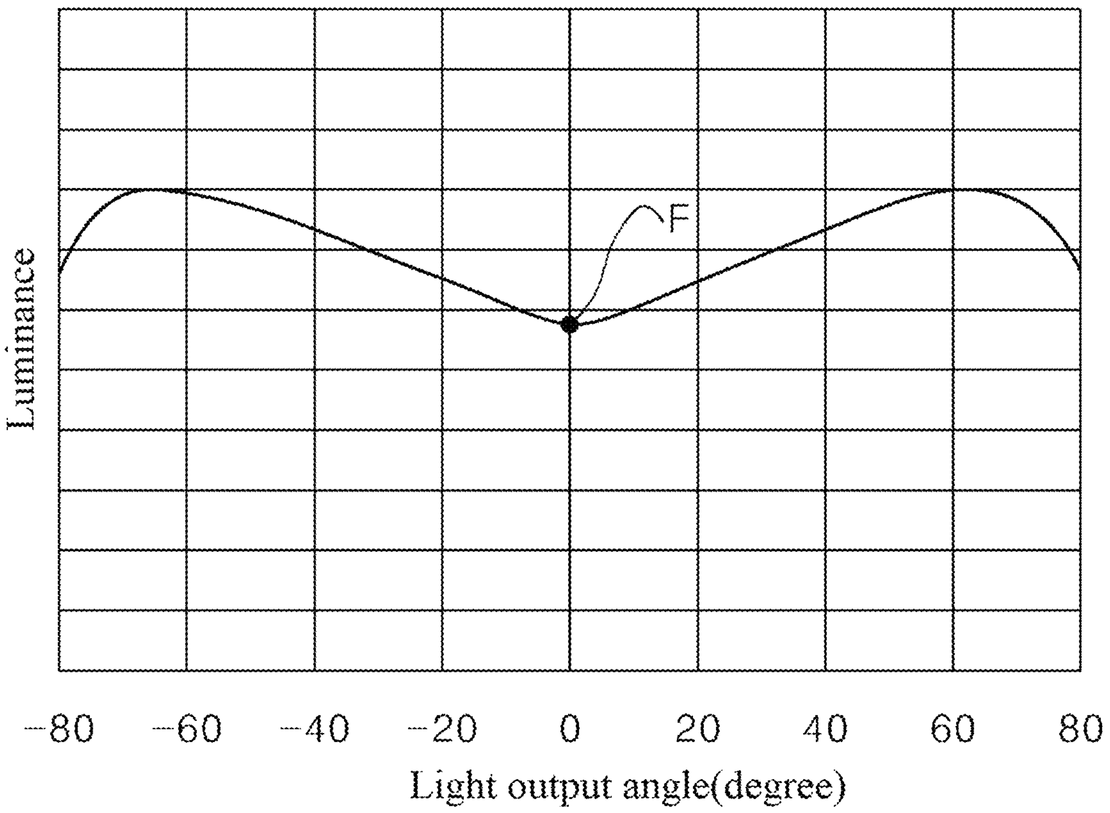

For example, with reference to FIG. 7C, a light output angle at which light is emitted in the frontward direction of the substrate 200 is defined as 0. When the light output angle is in a range smaller than 0, a direction at which the light travels is deviated from the frontward direction. When no voltage is applied to the light-emitting element 270 (V=OFF), and the liquid lens 585 has the flat surface, the optical characteristics of the display device do not change, and the luminance of light in the frontward direction F of the substrate 200 is relatively lowered.

Figure 8A:
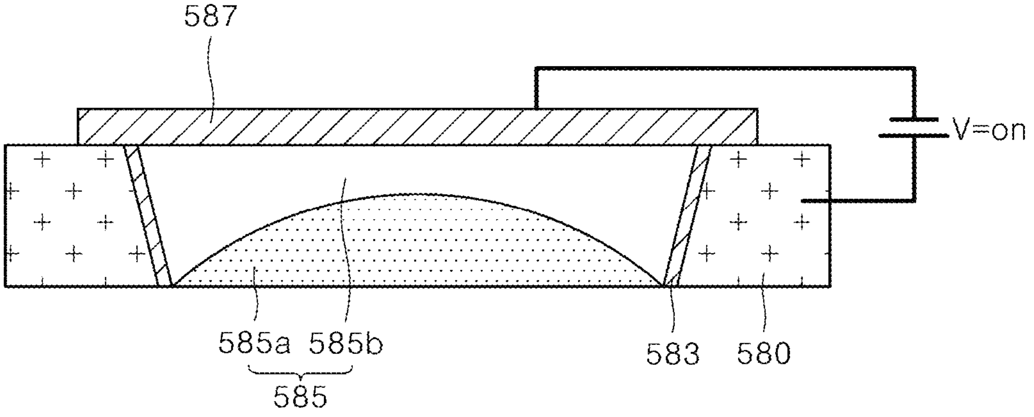
Figure 8B:
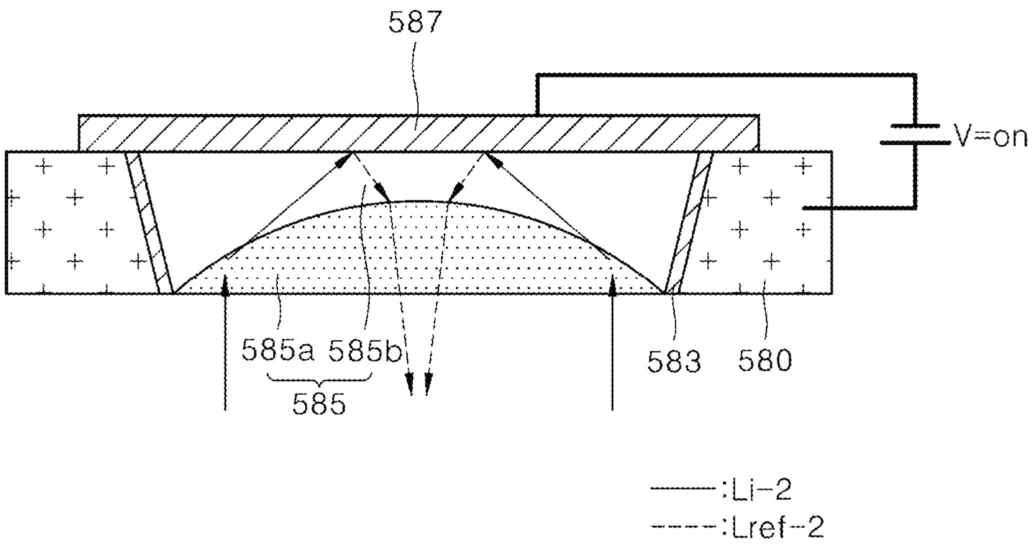

In contrast, as shown in FIGS. 8A and 8B, when the voltage is applied to the light-emitting element 270 (V=ON), the shape of the liquid lens 585 is deformed so that the transparent insulating liquid 585*a* has the convex surface. As the transparent insulating liquid 585*a* has the convex surface, a focal point is formed at a predetermined position of the upper reflective layer 587.

When light Li-2 is incident onto the transparent insulating liquid 585*a* while the transparent insulating liquid 585*a* has the convex surface, the incident light Li-2 is refracted at the convex surface of the transparent insulating liquid 585*a*, and then is incident on the upper reflective layer 587, and then is reflected from the upper reflective layer 587. Then, light Lref-2 reflected from the upper reflective layer 587 is refracted again at the convex surface of the transparent insulating liquid 585*a*, and then is directed in the frontward direction of the substrate 200.

Figure 8C:
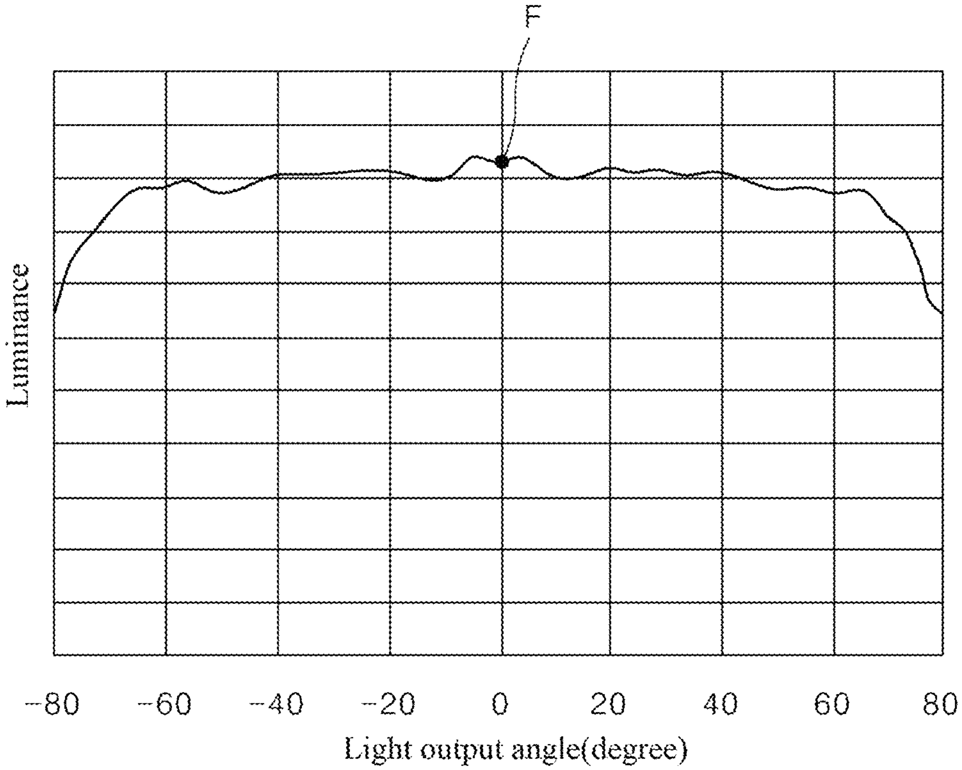

For example, in FIG. 8C, a light output angle at which light is emitted in the frontward direction of the substrate 200 is defined as 0. When the light output angle is in a range smaller than 0, a direction at which the light travels is deviated from the frontward direction. At this time, when the voltage is applied to the light-emitting element 270 (V=ON), the transparent insulating liquid 585*a* of the liquid lens 585 has a convex surface. Thus, an amount of the light directed in the frontward direction of the substrate 200 increases, such that the luminance level of light in the frontward direction F of the substrate 200 is maintained at a level equal to a luminance level of light in a different direction from the frontward direction F.

Figure 9:
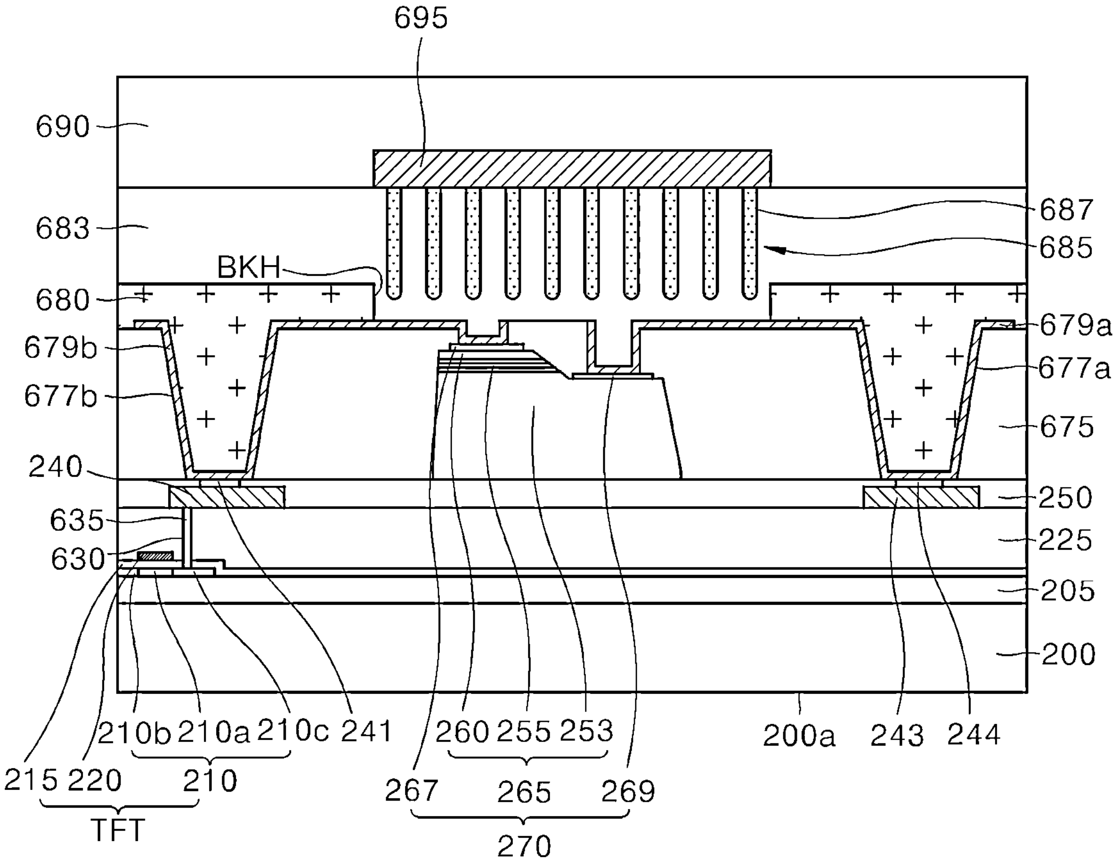
FIG. 9 is a cross-sectional view of a display device according to a sixth example embodiment of the present disclosure.
Figure 10A:
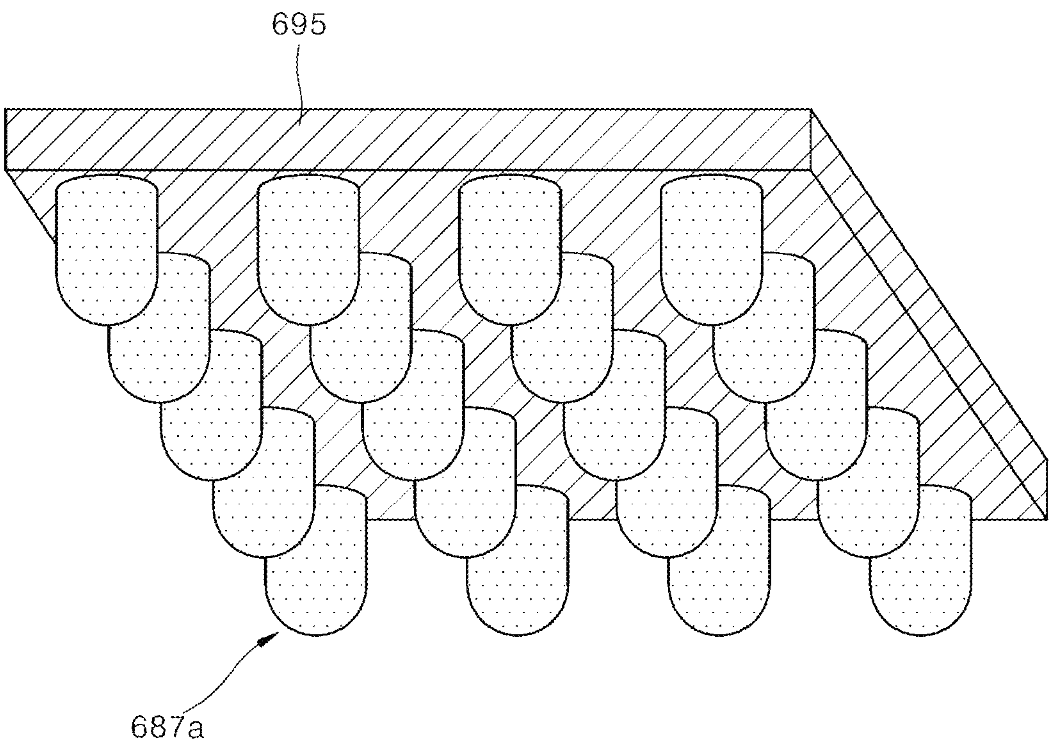
FIGS. 10A and 10B are diagrams shown to illustrate a shape of a high refractive index pattern of the sixth embodiment of the present disclosure.
Figure 10B:
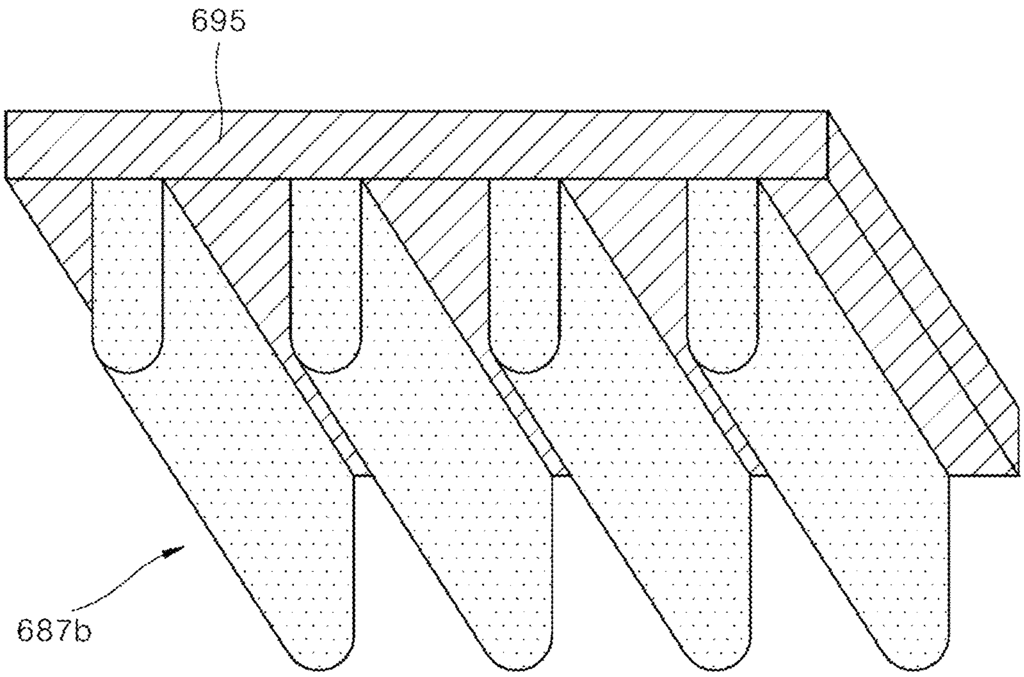
Figure 11:
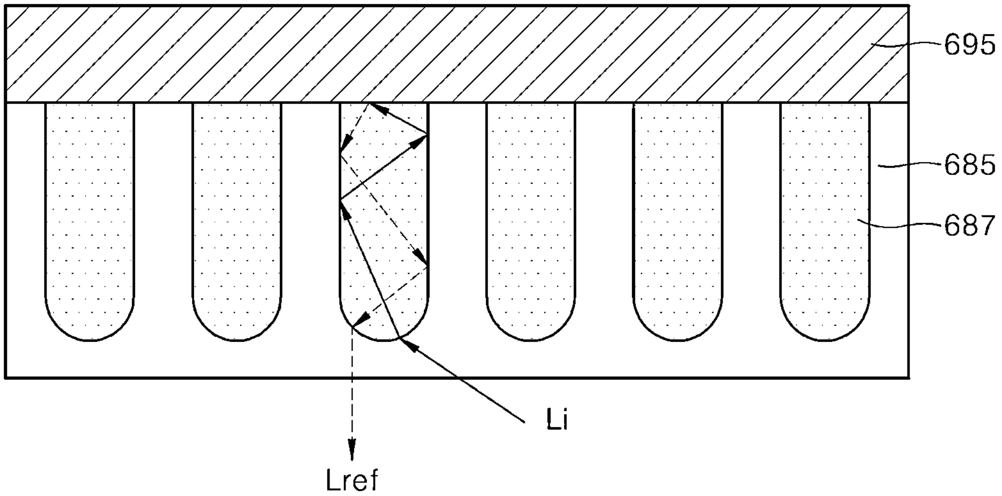
FIG. 11 is a diagram for illustrating an optical path according to the sixth embodiment of the present disclosure.

FIG. 9 is a cross-sectional view of a display device according to a sixth example embodiment of the present disclosure. FIGS. 10A and 10B are diagrams shown to illustrate a shape of a high refractive index pattern of the sixth embodiment of the present disclosure. FIG. 11 is a diagram for illustrating an optical path according to the sixth embodiment of the present disclosure.

With reference to FIG. 9, the light-emitting element 270 including a micro-LED is disposed on a surface of the substrate 200 on which a lower circuit element including a thin-film transistor TFT is formed. In this regard, the components marked with the same reference numerals as in FIG. 2 will be briefly described, and following descriptions are based on differences therebetween.

The light-emitting element 270 may include the nitride semiconductor structure 265, the first electrode 269, and the second electrode 267. The nitride semiconductor structure 265 may include the first semiconductor layer 253, the active layer 255 disposed on one side of an upper surface of the first semiconductor layer 253, and the second semiconductor layer 260 disposed on the active layer.

The light-emitting element 270 may be covered with a first insulating layer 675. The first insulating layer 675 may have a first contact-hole 677*a* and a second contact-hole 677*b* defined therein exposing the first conductive pad 244 and the second conductive pad 241, respectively. Further, the first insulating layer 675 may not cover portions of surfaces of the first electrode 269 and the second electrode 267 of the light-emitting element 270 to be exposed.

A first reflective electrode 679*a* and a second reflective electrode 679*b* are respectively disposed on exposed surfaces of the first contact-hole 677*a* and the second contact-hole 677*b*. Each of the first reflective electrode 679*a* and the second reflective electrode 679*b* may include a metal material with high reflectivity. The first reflective electrode 679*a* may be formed along and on the exposed surface of the first contact-hole 677*a* to be electrically connected to the wiring line 243 via the first conductive pad 244. Further, the first reflective electrode 679*a* may be connected to the first electrode 269. The second reflective electrode 679*b* may be formed along and on the exposed surface of the second contact-hole 677*b* to be electrically connected to the connection electrode 240 and the drain electrode 235 via the second conductive pad 241. Further, the second reflective electrode 679*b* may extend along and on an upper surface of the first insulating layer 675 to be connected to the second electrode 667.

Each of the first reflective electrode 679*a* and the second reflective electrode 679*b* are formed to surround each of both opposing side surfaces of the light-emitting element 270. The light emitted toward the side surface of the light-emitting element 270 and the totally internally reflected light may be reflected from each of the first reflective electrode 679*a* and the second reflective electrode 679*b* to be directed to the light-emitting surface 200*a* of the substrate 200. Accordingly, the display device according to the sixth embodiment of the present disclosure operates in a bottom-emission scheme in which light generated from the light-emitting element 270 is emitted toward the substrate 200.

A bank 680 having a bank-hole BKH defined therein is disposed on the first insulating layer 675 on which the first reflective electrode 679*a* and the second reflective electrode 679*b* have been formed. Remaining portions of the first contact-hole 677*a* and the second contact-hole 677*b* in which the first reflective electrode 679*a* and the second reflective electrode 679*b* have been respectively formed may be filled with a material constituting the bank 680. In one example, the bank 680 may further include a black matrix.

On the bank 680, a first planarization film 683 is disposed. The first planarization film 683 serves to cover the upper surface of the bank 680 and the exposed surfaces of the first reflective electrode 679*a* and the second reflective electrode 679*b* exposed through the bank-hole BKH. The first planarization film 683 may include an organic insulating layer, such as a photo acryl layer.

The first planarization film 683 may have a plurality of trench-holes 685 defined therein. In one example, the plurality of trench-holes 685 may be defined in the first planarization film 683 and may be arranged in a matrix form (M*N, where M and N are natural numbers) along first and second horizontal directions of the substrate 200 intersecting each other. In another example, each of the trench-holes 685 may be formed in the first planarization film 683 and may extend along one of the first and second horizontal directions of the substrate 200 intersecting each other.

The trench-hole 685 may have an aspect ratio greater than at least 1:2. Further, a bottom surface of the trench-hole 685 may include a hemi-spherical shape. A high refractive index pattern 687 may fill the plurality of trench-holes 685. As the high refractive index pattern 687 is formed along a shape of the trench-hole 685, the high refractive index pattern 687 may have a hemi-spherical bottom surface. When the bottom surface as a light output surface of the high refractive index pattern 687 is formed as a flat bottom surface, reflected light spreads along the flat bottom surface, the light amount at which light is directed in the frontward direction of the substrate 200 may decrease. Accordingly, the bottom surface as the light output surface of the high refractive index pattern 687 may have the hemi-spherical shape.

The shape of the high refractive index pattern 687 may have various shapes according to the shape of the trench-hole 685. For example, as shown in FIG. 10A, when the plurality of trench-holes 685 are arranged in a matrix form and are defined in the first planarization film 683, the high refractive index pattern 687*a* formed according to the shape of the trench-hole 685 may have isolated portions arranged to be spaced from each other in the first and second horizontal directions of the substrate intersecting each other. In this case, adjacent isolated portions of the high refractive index pattern 687*a* may be isolated from each other via the first planarization film 683.

In another example, as shown in FIG. 10B, when the plurality of trench-holes 685 are formed in the first planarization film 683 such that each of the plurality of trench-holes 685 extends in one of the first and second horizontal directions of the substrate intersecting each other, the high refractive index pattern 687*b* may have isolated portions arranged to be spaced from each other such that each of the isolated portions extends in one of the first and second horizontal directions of the substrate intersecting each other. In this case, adjacent isolated portions of the high refractive index pattern 687*a* may be isolated from each other via the first planarization film 683.

The high refractive index pattern 687 may include a material having a higher refractive index than that of the first planarization film 683. For example, when the first planarization film 683 is made of a material having a refractive index of 1.4, the high refractive index pattern 687 may be made of a material having a refractive index greater than 1.6.

In this case, total internal reflection occurs at a side surface of the high refractive index pattern 687, which has a relatively higher refractive index than that of the first planarization film 683. Then, no light is emitted toward the first planarization film 683, and the light source reflected via the total internal reflection may be emitted only through a light output surface of the high refractive index pattern 687. This may induce a travel path of light in a frontward direction of the substrate 200, thereby improving luminance of light in a frontward direction.

An upper reflective layer 695 is disposed on the high refractive index pattern 687. The upper reflective layer 695 may be formed to have a plate shape with a flat surface. The upper reflective layer 695 may contact the upper surface of the high refractive index pattern 687, and may be formed to have a width greater than that of the bank-hole BKH. The upper reflective layer 695 may include the same material as that of each of the first reflective electrode 679*a* and the second reflective electrode 679*b*.

The high refractive index pattern 687 disposed between the upper reflective layer 694 and the light-emitting element 270 may totally internally reflect the light emitted from the light-emitting element 270 to direct the light toward the upper reflective layer 695. The upper reflective layer 694 serves to reflect incident light thereto that is refracted at the high refractive index pattern 687 to be directed toward the light-emission surface 200*a* of the substrate 200. Accordingly, the amount of light emitted in a frontward direction may be increased, thereby improving luminance of light in a frontward direction of the light-emitting element.

For example, as shown in FIG. 11, when light Li is incident on the high refractive index pattern 687, the light is not emitted toward the first planarization film 683 but totally internally reflected therein due to the difference of the refractive indexes of the first planarization film 683 and the high refractive index pattern 687. The totally internally reflected light is reflected from the upper reflective layer 695 that is in contact with the upper surface of the high refractive index pattern 687, and then is reflected from an inner side surface of the high refractive index pattern 687, for example, is subjected to total internal reflection, and then travels to a bottom surface of the high refractive index pattern 687. Then, the reflected light Lref may be emitted to the outside through the light output surface of the high refractive index pattern 687 having the hemi-spherical shape. Accordingly, a travel path of light through a light output surface located in the frontward direction of the substrate 200 may be induced, so that the luminance of light in the frontward direction may be improved.

A second planarization film 690 is formed on the upper reflective layer 695 and the first planarization film 683. The second planarization film 690 may be thick enough to planarize an upper surface thereof. The first planarization film 683 and the second planarization film 690 may include the same material. In one example, each of the first planarization film 683 and the second planarization film 690 may include an organic insulating layer, such as a photo acryl layer. However, the present disclosure is not limited thereto. For example, each of the first planarization film 683 and the second planarization film 690 may include an inorganic insulating layer or may include a structure in which organic insulating layers and inorganic insulating layers are alternately stacked with each other.

In the display device according to the sixth embodiment of the present disclosure, the light incident into the high refractive index pattern through an incident surface thereof is totally internally reflected therein, and then re-reflected from the upper reflective layer, and then is outputted through the incident surface of the high refractive index pattern. Thus, an amount of light at which the light is outputted in the frontward direction may be improved.

Figure 12:
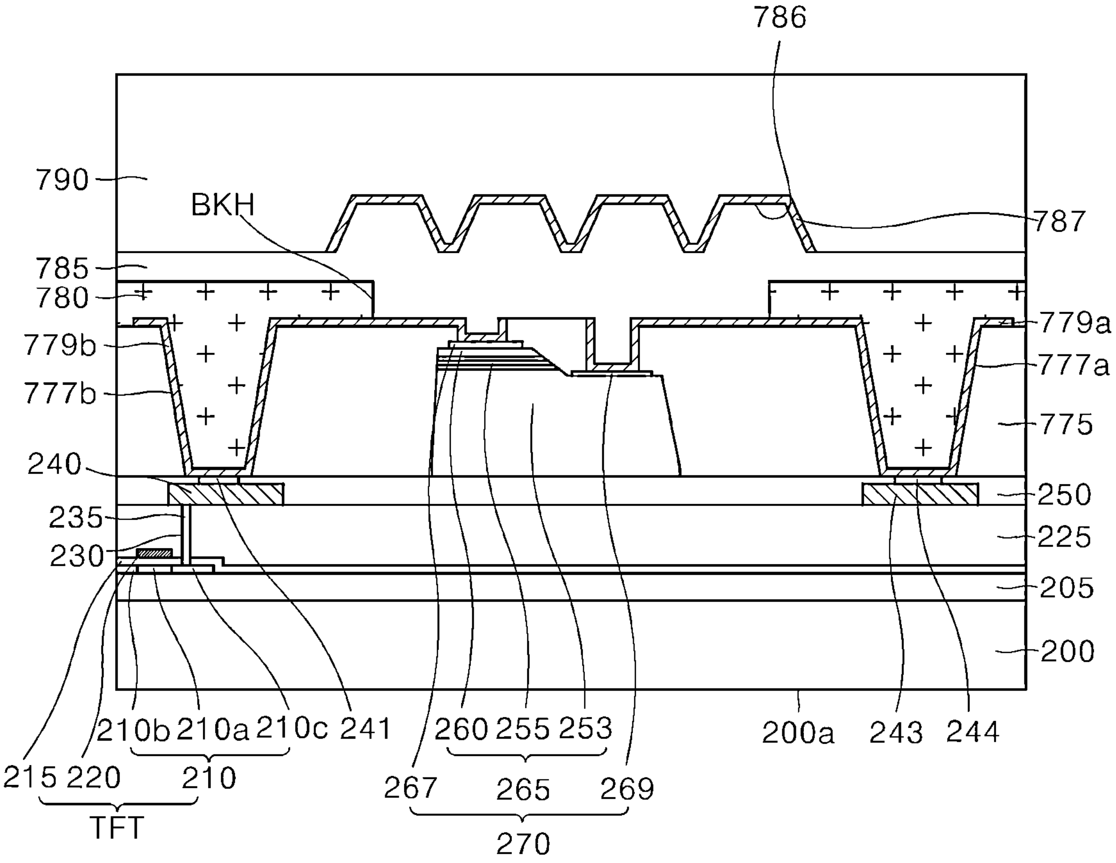
FIG. 12 is a cross-sectional view of a display device according to a seventh example embodiment of the present disclosure.
Figure 13:
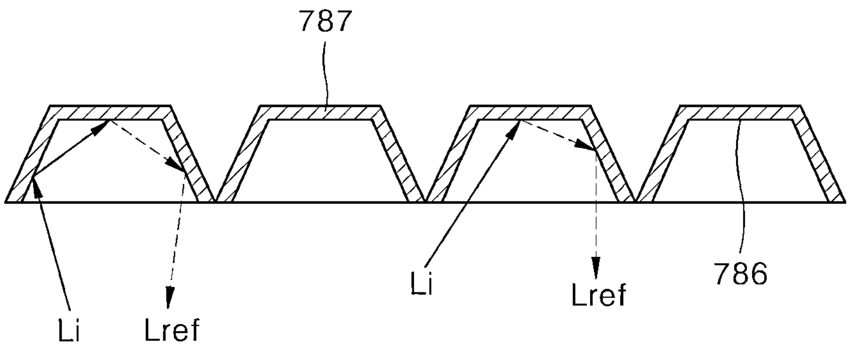
FIG. 13 is a diagram for illustrating an optical path of a display device according to the seventh embodiment of the present disclosure.

FIG. 12 is a cross-sectional view of a display device according to a seventh example embodiment of the present disclosure. FIG. 13 is a diagram for illustrating an optical path of a display device according to the seventh embodiment of the present disclosure.

As illustrated in FIGS. 12 and 13, the light-emitting element 270 including a micro-LED is disposed on a surface of the substrate 200 on which a lower circuit element including a thin-film transistor TFT is formed. In this regard, the components marked with the same reference numerals as in FIG. 2 will be briefly described, and following descriptions are based on differences therebetween.

The light-emitting element 270 may include the nitride semiconductor structure 265, the first electrode 269, and the second electrode 267. The nitride semiconductor structure 265 may include the first semiconductor layer 253, the active layer 255 disposed on one side of an upper surface of the first semiconductor layer 253, and the second semiconductor layer 260 disposed on the active layer.

The light-emitting element 270 may be covered with a first insulating layer 775. The first insulating layer 775 may have a first contact-hole 777*a* and a second contact-hole 777*b* defined therein exposing the first conductive pad 244 and the second conductive pad 241, respectively. Further, the first insulating layer 775 may not cover portions of surfaces of the first electrode 269 and the second electrode 267 of the light-emitting element 270 to be exposed.

A first reflective electrode 779*a* and a second reflective electrode 779*b* are respectively disposed on exposed surfaces of the first contact-hole 777*a* and the second contact-hole 777*b*. Each of the first reflective electrode 779*a* and the second reflective electrode 779*b* may include a metal material with high reflectivity. The first reflective electrode 779*a* may be formed along and on the exposed surface of the first contact-hole 777*a* to be electrically connected to the wiring line 243 via the first conductive pad 244. Further, the first reflective electrode 779*a* may be connected to the first electrode 269. The second reflective electrode 779*b* may be formed along and on the exposed surface of the second contact-hole 777*b* to be electrically connected to the connection electrode 240 and the drain electrode 235 via the second conductive pad 241. Further, the second reflective electrode 779*b* may extend along and on an upper surface of the first insulating layer 775 to be connected to the second electrode 767.

Each of the first reflective electrode 779*a* and the second reflective electrode 779*b* are formed to surround each of both opposing side surfaces of the light-emitting element 270. The light emitted toward the side surface of the light-emitting element 270 and the totally internally reflected light may be reflected from each of the first reflective electrode 779*a* and the second reflective electrode 779*b* to be directed to the light-emitting surface 200*a* of the substrate 200. Accordingly, the display device according to the seventh embodiment of the present disclosure operates in a bottom-emission scheme in which light generated from the light-emitting element 270 is emitted toward the substrate 200.

A bank 780 having a bank-hole BKH defined therein is disposed on the first insulating layer 775 on which the first reflective electrode 779*a* and the second reflective electrode 779*b* have been formed. Remaining portions of the first contact-hole 777*a* and the second contact-hole 777*b* in which the first reflective electrode 779*a* and the second reflective electrode 779*b* have been respectively formed may be filled with a material constituting the bank 780. In one example, the bank 780 may further include a black matrix.

On the bank 780, a first planarization film 785 is disposed. The first planarization film 785 may include a protrusion pattern 786 formed at an upper surface thereof and in an area corresponding to the bank-hole BKH. The protrusion pattern 786 may have a structure in which a plurality of protrusions are consecutively and repeatedly arranged and are connected to each other. The protrusions may be regularly repeatedly arranged. Each of the plurality of protrusions may have a flat upper surface. For example, each protrusion may have a mesa structure.

An upper reflective layer 787 is disposed on the protrusion pattern 786 composed of the plurality of protrusions.

The upper reflective layer 787 is formed according to a profile of the protrusion pattern 786. Accordingly, a lower surface of the upper reflective layer 787 may have a shape in which protrusions are consecutively and repeatedly arranged and are connected to each other, and each of the protrusions has a flat upper surface.

The upper reflective layer 787 may include a metal material with high reflectivity, and may include the same material as that of each of the first reflective electrode 779*a* and the second reflective electrode 779*b*. The upper reflective layer 787 may have a width larger than that of the bank-hole BKH. The upper reflective layer 787 reflects light emitted in the upward direction from the light-emitting element 270 to be directed toward the substrate 200.

For example, as shown in FIG. 13, when light Li emitted from the light-emitting element 270 is incident on the upper reflective layer 787, the light Li is incident on the flat upper surface of the protrusion of the protrusion pattern 786 of the first planarization film 785 and is reflected from the upper reflective layer 787. The reflected light is refracted at the protrusion pattern 786 and then is again incident onto the upper reflective layer 787, and then, reflected light Lref is directed toward the substrate 200. Accordingly, the amount of light emitted in the frontward direction of the substrate 200 may increase such that the luminance of light in the frontward direction of the light-emitting element 270 may be improved. In this regard, the upper reflective layer 787 has a mesa shape in which the upper surface thereof is flat. The number of times the incident light Li is reflected from the flat upper surface and the sidewall of the upper reflective layer 787 increases, so that the light may be easily directed toward the substrate 200.

The second planarization film 790 is formed on the first planarization film 785 and the upper reflective layer 787. The second planarization film 790 may be thick enough to planarize an upper surface thereof. Each of the first planarization film 785 and the second planarization film 790 may include an organic insulating layer, such as a photo acryl layer. However, the present disclosure is not limited thereto. For example, each of the first planarization film 785 and the second planarization film 790 may include an inorganic insulating layer.

The display device according to the seventh embodiment of the present disclosure includes the first reflective electrode and the second reflective electrode which reflect the light emitted toward the side surface of the light-emitting element and the totally internally reflected light to be directed toward the substrate, and the upper reflective layer located above the light-emitting element to reflect the light emitted in the upward direction to be directed to the substrate. In this regard, as the number of times light is reflected on the upper reflective layer of the mesa shape increases, the amount of light emitted in the frontward direction is increased to improve the luminance of light in the frontward direction of the light-emitting element.

A first aspect of the present disclosure provides a display device comprising a substrate having a first surface and a second surface opposite to the first surface; a micro-LED on the first surface of the substrate, the micro-LED including a light-emitting area; a reflective electrode at at least one side surface of the micro-LED; and an upper reflective layer facing and overlapping the light-emitting area of the micro-LED, wherein the upper reflective layer is configured to reflect light emitted from the light-emitting area of the micro-LED to be directed toward the second surface of the substrate.

In one implementation of the first aspect, the upper reflective layer includes a plurality of protrusion patterns protruding toward the substrate.

In one implementation of the first aspect, the plurality of protrusion patterns have a same width and a same depth, and are consecutively arranged in one direction.

In one implementation of the first aspect, the plurality of protrusion patterns have different widths and different depths, wherein distances between adjacent protrusion patterns are different from each other.

In one implementation of the first aspect, the display device further comprises a high refractive index pattern between the micro-LED and the upper reflective layer.

In one implementation of the first aspect, the high refractive index pattern includes a plurality of convex portions consecutively and repeatedly arranged and connected to each other, wherein each of the convex portions is convex toward the upper reflective layer.

In one implementation of the first aspect, the high refractive index pattern includes a plurality of protrusions protruding toward the light-emitting area of the micro-LED, wherein a bottom surface of each of the plurality of protrusions has a hemi-spherical shape.

In one implementation of the first aspect, the plurality of protrusions are arranged along first and second horizontal directions of the substrate intersecting each other in a matrix form.

In one implementation of the first aspect, each of the plurality of protrusions extends in one of first and second horizontal directions of the substrate intersecting each other.

In one implementation of the first aspect, the display device further comprises a liquid lens disposed between the micro-LED and the upper reflective layer, wherein the liquid lens includes a transparent insulating liquid and a conductive liquid disposed on the transparent insulating liquid, and wherein when a voltage is applied to the liquid lens, the conductive liquid thereof is deformed to have a convex surface.

A second aspect of the present disclosure provides a display device comprising a substrate; a protective layer on the substrate; a micro-LED on the protective layer; a contact-hole on at least one side surface of the micro-LED; a reflective electrode on an exposed surface of the contact-hole; a bank filling the contact-hole, wherein the bank has a bank hole defined therein exposing a light-emitting area of the micro-LED; a planarization film on the light-emitting area of the micro-LED and the bank; and an upper reflective layer on the planarization film to vertically overlap the light-emitting area of the micro-LED.

In one implementation of the second aspect, the planarization film receives therein a groove pattern including a plurality of recesses in an area corresponding to the bank hole, wherein the upper reflective layer includes protrusion patterns respectively filling the recesses of the groove pattern and protruding toward the substrate.

In one implementation of the second aspect, the groove pattern has a structure in which the plurality of recesses having a same width and a same depth are consecutively arranged in one direction, wherein the plurality of recesses are connected to each other, and wherein each of the recesses has an inclined side surface.

In one implementation of the second aspect, the upper reflective layer has a width larger than a width of the bank hole.

In one implementation of the second aspect, the groove pattern has a structure in which the plurality of recesses have different widths, and different depths, wherein distances between adjacent ones of the plurality of recesses are different from each other, and wherein the plurality of recesses are arranged in one direction.

In one implementation of the second aspect, the display device further comprises a high refractive index pattern between the planarization film and the upper reflective layer, wherein the high refractive index pattern has a refractive index higher than a refractive index of the planarization film.

In one implementation of the second aspect, the high refractive index pattern includes a plurality of convex portions consecutively and repeatedly arranged, wherein the plurality of convex portions are connected to each other, and wherein each of the convex portions is convex toward the upper reflective layer.

In one implementation of the second aspect, one surface of the upper reflective layer facing the convex portions of the high refractive index pattern is flat.

In one implementation of the second aspect, the bank hole has a trench shape including both opposing sidewalls and a bottom surface, wherein each of the both opposing sidewalls has an inclined surface, and wherein the bank has a stepped upper surface such that a vertical level of a top surface of the bank is higher than a vertical level of a top of the contact-hole.

In one implementation of the second aspect, the display device further comprises: a sidewall reflective electrode on each of the both opposing sidewalls of the bank hole; and a liquid lens filling the bank hole, wherein the liquid lens includes a transparent insulating liquid and a conductive liquid on the transparent insulating liquid, wherein the upper reflective layer is disposed on the liquid lens, and wherein when a voltage is applied to the liquid lens, the conductive liquid thereof is deformed to have a convex surface.

In one implementation of the second aspect, the transparent insulating liquid includes a material immiscible with the conductive liquid, wherein the conductive liquid includes a salt.

In one implementation of the second aspect, the planarization film has a plurality of trench holes defined therein in an area corresponding to the bank hole, wherein a high refractive index pattern fills the plurality of trench holes, wherein the high refractive index pattern has a refractive index higher than a refractive index of the planarization film, and wherein an upper surface of the high refractive index pattern contacts one surface of the upper reflective layer.

In one implementation of the second aspect, each of the plurality of trench holes has an aspect ratio greater than at least 1:2, and wherein a bottom surface of each of the plurality of trench holes has a hemi-spherical shape.

In one implementation of the second aspect, the plurality of trench-holes are arranged along first and second horizontal directions of the substrate intersecting each other in a matrix form.

In one implementation of the second aspect, each of the plurality of trench-holes extends in one of first and second horizontal directions of the substrate intersecting each other.

In one implementation of the second aspect, the planarization film has a protrusion pattern on an upper surface thereof and in an area corresponding to the bank hole, wherein the protrusion pattern includes a plurality of protrusions, and wherein the upper reflective layer is along and on a profile of the protrusion pattern.

In one implementation of the second aspect, each of the plurality of protrusions has a mesa shape in which an upper surface thereof is flat.

According to each of the implementations of the present disclosure, introducing the micro-LED display device operating in the bottom-emission scheme rather than the top-emission scheme may allow the light output efficiency to be prevented from deteriorating, which may otherwise occur during an operation of a micro-LED display device operating in the top-emission scheme. Further, the first reflective electrode, the second reflective electrode, and the upper reflective layer may be introduced to realize the micro-LED display device operating in the bottom-emission scheme. Thus, the light path may be controlled so that the luminance of light in the frontward direction is prevented from deteriorating, and a uniform light emission profile may be obtained in an entire light-emitting area.

Further, in a micro-LED display device operating in the bottom-emission scheme, the upper electrode layer may be configured in various shapes so that the path of light may be effectively changed such that the light is directed in the frontward direction of the substrate.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a substrate having a first surface and a second surface opposite to the first surface;

a micro-LED on the first surface of the substrate, the micro-LED including a light-emitting area;

an insulating layer covering at least one lateral surface of the micro-LED, and the insulating layer having a contact-hole disposed outside the at least one lateral surface of the micro-LED;

a reflective electrode electrically connected to the micro-LED and positioned on the insulating layer and in the contact-hole;

a bank on the reflective electrode and in the contact-hole, and the bank having a bank hole at a position overlapping with the light-emitting area of the micro-LED; and an upper reflective layer facing and overlapping the light-emitting area of the micro-LED, wherein the upper reflective layer is configured to reflect light emitted from the light-emitting area of the micro-LED to be directed toward the second surface of the substrate.

2. The display device of claim 1, wherein the upper reflective layer includes a plurality of protrusion patterns protruding toward the substrate.

3. The display device of claim 2, wherein the plurality of protrusion patterns have a same width and a same depth, and wherein the plurality of protrusion patterns are consecutively arranged in one direction.

4. A display device, comprising:

a substrate;

a protective layer on the substrate;

a micro-LED on the protective layer;

an insulating layer disposed on the protective layer and covering at least one lateral surface of the micro-LED, and the insulating layer having a contact-hole disposed outside the at least one lateral surface of the micro-LED;

a reflective electrode electrically connected to the micro-LED and positioned on the insulating layer and in the contact-hole;

a bank on the reflective electrode and in the contact-hole, and the bank having a bank hole at a position overlapping with a light-emitting area of the micro-LED, the light-emitting area being an area exposed by the bank;

a planarization film on the light-emitting area of the micro-LED and the bank; and an upper reflective layer on the planarization film to vertically overlap the light-emitting area of the micro-LED.

5. The display device of claim 4, wherein the planarization film further comprises a groove pattern including a plurality of recesses in an area corresponding to the bank hole, and wherein the upper reflective layer includes protrusion patterns respectively filling the recesses of the groove pattern and protruding toward the substrate.

6. The display device of claim 5, wherein the groove pattern has a structure in which the plurality of recesses having a same width and a same depth are consecutively arranged in one direction, and wherein the plurality of recesses are connected to each other, and wherein each of the recesses has an inclined side surface.

7. The display device of claim 4, wherein the upper reflective layer has a width larger than a width of the bank hole.

* * * * *